United States Patent
Miyamori

(10) Patent No.: US 11,417,696 B2
(45) Date of Patent: Aug. 16, 2022

(54) IMAGING ELEMENT COMPRISING POLARIZATION UNIT WITH A CONDUCTIVE MEMBER AS AN ELECTRODE FOR A CHARGE HOLDER

(71) Applicant: SONY SEMICONDUCTOR SOLUTIONS CORPORATION, Kanagawa (JP)

(72) Inventor: Yuichi Miyamori, Kumamoto (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 194 days.

(21) Appl. No.: 16/960,994

(22) PCT Filed: Nov. 29, 2018

(86) PCT No.: PCT/JP2018/043908
§ 371 (c)(1),
(2) Date: Jul. 9, 2020

(87) PCT Pub. No.: WO2019/146249
PCT Pub. Date: Aug. 1, 2019

(65) Prior Publication Data
US 2021/0084250 A1 Mar. 18, 2021

(30) Foreign Application Priority Data
Jan. 29, 2018 (JP) .............................. JP2018-012657

(51) Int. Cl.
*H01L 27/146* (2006.01)
*H04N 5/3745* (2011.01)
*G02B 5/30* (2006.01)

(52) U.S. Cl.
CPC .. *H01L 27/14625* (2013.01); *H01L 27/14603* (2013.01); *H01L 27/14609* (2013.01);
(Continued)

(58) Field of Classification Search
CPC ......... H01L 27/14625; H01L 27/14609; H01L 27/14627; H01L 27/14603;
(Continued)

(56) References Cited

U.S. PATENT DOCUMENTS 9,515,115 B2 * 12/2016 Maruyama ........ H01L 27/14643
2012/0287297 A1 * 11/2012 Fukuda ................ G02B 5/3058
257/E31.127

(Continued)

FOREIGN PATENT DOCUMENTS

JP 2017-076683 A 4/2017
JP 2017-084892 A 5/2017
(Continued)

OTHER PUBLICATIONS

International Search Report and Written Opinion of PCT Application No. PCT/JP2018/043908, dated Feb. 12, 2019, 06 pages of ISRWO.

*Primary Examiner* — Jennifer D Bennett
*Assistant Examiner* — Erin R Garber
(74) *Attorney, Agent, or Firm* — Chip Law Group

(57) ABSTRACT

A configuration is simplified of an imaging element including a polarizing unit that transmits light in a specific polarization direction. The imaging element includes a polarizing unit, a photoelectric conversion unit, a first charge holding unit, an image signal generation unit, and a second charge holding unit. The photoelectric conversion unit includes a conductive member and transmits the light in the specific polarization direction of incident light. The photoelectric conversion unit generates charge by photoelectric conversion based on the light transmitted through the polarizing unit. The first charge holding unit holds the charge generated. The image signal generation unit generates an image signal depending on the charge held in the first charge holding unit. The second charge holding unit includes the conductive member of the polarizing unit as an electrode, and holds the charge generated.

9 Claims, 23 Drawing Sheets

(52) U.S. Cl.
CPC ..... *H01L 27/14623* (2013.01); *H04N 5/3745* (2013.01); *G02B 5/3058* (2013.01)

(58) Field of Classification Search
CPC ......... H01L 27/14623; H01L 27/14621; H01L 27/14629; H01L 27/1463; H01L 27/14643; H01L 2224/73265; G02B 5/3058; G02B 5/30; G02B 5/20; H04N 5/3745; H04N 5/374; H04N 5/369; G11C 16/0483
See application file for complete search history.

(56) References Cited

U.S. PATENT DOCUMENTS

| | | | | |
|---|---|---|---|---|
| 2014/0151531 | A1* | 6/2014 | Yamashita | ........ H01L 27/14621 257/435 |
| 2018/0286908 | A1 | 10/2018 | Yamazaki et al. | |
| 2018/0308883 | A1 | 10/2018 | Yanagita et al. | |

FOREIGN PATENT DOCUMENTS

| | | | | |
|---|---|---|---|---|
| JP | 2017-130567 | A | 7/2017 | |
| WO | WO-2017018258 | A1 * | 2/2017 | ............. H01L 27/14 |
| WO | WO-2017064845 | A1 * | 4/2017 | ....... H01L 27/14605 |
| WO | 2017/126232 | A1 | 7/2017 | |

* cited by examiner

IMAGING ELEMENT COMPRISING POLARIZATION UNIT WITH A CONDUCTIVE MEMBER AS AN ELECTRODE FOR A CHARGE HOLDER

CROSS REFERENCE TO RELATED APPLICATIONS

This application is a U.S. National Phase of International Patent Application No. PCT/JP2018/043908 filed on Nov. 29, 2018, which claims priority benefit of Japanese Patent Application No. JP 2018-012657 filed in the Japan Patent Office on Jan. 29, 2018. Each of the above-referenced applications is hereby incorporated herein by reference in its entirety.

TECHNICAL FIELD

The present technology relates to an imaging element and an imaging device. More specifically, the present technology relates to an imaging element and an imaging device that captures light in a specific polarization direction of incident light.

BACKGROUND ART

An imaging element has conventionally been used that acquires polarization information of incident light by performing photoelectric conversion by arranging a polarizing unit that transmits light in a specific polarization direction for each pixel. Image processing is performed on the basis of the acquired polarization information, whereby, for example, a three-dimensional shape of a subject can be easily grasped. This is because reflected light from an object is polarized in a different direction for each surface of the object, so that it is possible to easily acquire a shape of the surface of the object by selecting the polarization direction and capturing an image. Furthermore, in an imaging element used for a monitoring device or the like, use is possible for removing an image reflected in a windshield of a car. This is because the image reflected in the windshield of the car is strongly polarized in a specific direction and can be easily removed by acquiring polarization information. As such a polarizing unit, a polarizing unit including a wire grid is used. This is a polarizing unit including a plurality of lines arranged at a pitch smaller than a wavelength of incident light.

As an imaging element including such a polarizing unit, an imaging element has been devised in which a polarizing unit including a plurality of metal lines that reflects or absorbs light is connected to a light-shielding film of a pixel, or the like. Here, the light-shielding film is a film that shields light incident from an adjacent pixel, and is a film arranged at a boundary between pixels. Formation of the polarizing unit in the imaging element is performed by processing a formed metal film into the plurality of metal lines. Dry etching or the like is used for processing the metal film. At this time, dry etching is performed in a state where the metal film is connected to the light-shielding film of the pixel, or the like, whereby electrification of the metal film can be prevented, and damage due to discharge can be prevented (for example, see Patent Document 1).

CITATION LIST

Patent Document

Patent Document 1: Japanese Patent Application Laid-Open No. 2017-76683

SUMMARY OF THE INVENTION

Problems to be Solved by the Invention

Pixels are arranged in a two-dimensional lattice on the imaging element. These pixels each generate charge depending on incident light by photoelectric conversion. The generated charge is held by a charge holding unit, and an image signal depending on the held charge is generated and output from each pixel. For holding the charge, a floating diffusion region (floating diffusion) is used that is a region formed in a diffusion layer of a semiconductor substrate. However, in a case where a charge holding unit is required in addition to the floating diffusion, it is necessary to newly form a capacitor. For example, in an imaging element that performs a global shutter that transfers an image signal generated depending on a held charge while simultaneously holding the charge of all pixels after an exposure period has elapsed, it is necessary to hold the charge in two stages, a stage after the exposure period has elapsed and a stage of generation of the image signal. In a case where a plurality of charge holding units is formed in a pixel as described above, it is necessary to arrange a new charge holding unit such as a capacitor in each pixel. In such an application, in the conventional technology described above, a capacitor is arranged in a pixel in addition to the polarizing unit, and thus there is a problem that a configuration of the pixel is complicated.

The present technology has been made in view of the problem described above, and aims to simplify the configuration of an imaging element including the polarizing unit that transmits light in the specific polarization direction.

Solutions to Problems

The present technology has been made to solve the problem described above, and a first aspect of the present technology is an imaging element including: a polarizing unit that includes a conductive member and transmits light in a specific polarization direction of incident light; a photoelectric conversion unit that generates charge by photoelectric conversion based on the light transmitted through the polarizing unit; a first charge holding unit that holds the charge generated; an image signal generation unit that generates an image signal depending on the charge held in the first charge holding unit; and a second charge holding unit that includes the conductive member of the polarizing unit as an electrode, and holds the charge generated. This brings about an effect that the conductive member of the polarizing unit and the electrode of the second charge holding unit are commonly used. It is assumed that the configuration of the pixel is simplified.

Furthermore, in the first aspect, the polarizing unit may include a wire grid in which a plurality of the conductive members having linear shapes is arranged adjacently at a predetermined interval. This brings about an effect that the polarizing unit includes the wire grid.

Furthermore, in the first aspect, the second charge holding unit may include a capacitor formed by two of the conductive members having linear shapes adjacent to each other among the plurality of conductive members having linear shapes. This brings about an effect that the two conductive members having linear shapes adjacent to each other of the polarizing unit constitute the capacitor.

Furthermore, in the first aspect, the polarizing unit may include the conductive members having linear shapes each including an insulating layer and two conductor layers sandwiching the insulating layer, and the second charge holding unit may include a capacitor formed by the two conductor layers. This brings about an effect that the polarizing unit is used having a three-layer structure.

Furthermore, in the first aspect, in the second charge holding unit, the two conductor layers in the conductive members having linear shapes adjacent to each other may be charged to identical potentials. This brings about an effect that the conductor layers charged to the identical potentials are arranged in the same layer in the conductive members having linear shapes adjacent to each other. It is assumed that the capacitor is formed by the two conductor layers arranged in different layers.

Furthermore, in the first aspect, in the second charge holding unit, the two conductor layers in the conductive members having linear shapes adjacent to each other may be charged to different potentials. This brings about an effect that the conductor layers charged to the different potentials are arranged in the same layer in the conductive members having linear shapes adjacent to each other. It is assumed that the capacitor is formed by the two conductor layers arranged in the different conductive members having linear shapes.

Furthermore, in the first aspect, the first charge holding unit may hold the charge transferred from the second charge holding unit. This brings about an effect that the image signal is generated depending on the charge generated by the photoelectric conversion unit and transferred via the second charge holding unit.

Furthermore, in the first aspect, the image signal generation unit may generate an image signal depending on the charges held in the first charge holding unit and the second charge holding unit. This brings about an effect that the image signal is generated depending on the charges simultaneously held in the first charge holding unit and the second charge holding unit.

Furthermore, a second aspect of the present technology is an imaging device including: a polarizing unit that includes a conductive member and transmits light in a specific polarization direction of incident light; a photoelectric conversion unit that generates charge by photoelectric conversion based on the light transmitted through the polarizing unit; a first charge holding unit that holds the charge generated; an image signal generation unit that generates an image signal depending on the charge held in the first charge holding unit; a second charge holding unit that includes the conductive member of the polarizing unit as an electrode, and holds the charge generated; and a processing circuit that processes the image signal generated. This brings about an effect that the conductive member of the polarizing unit and the electrode of the second charge holding unit are commonly used. It is assumed that the configuration of the pixel is simplified.

Effects of the Invention

According to the present technology, an excellent effect is achieved of simplifying the configuration of the imaging element including the polarizing unit that transmits light in the specific polarization direction.

MODE FOR CARRYING OUT THE INVENTION

Figure 1:
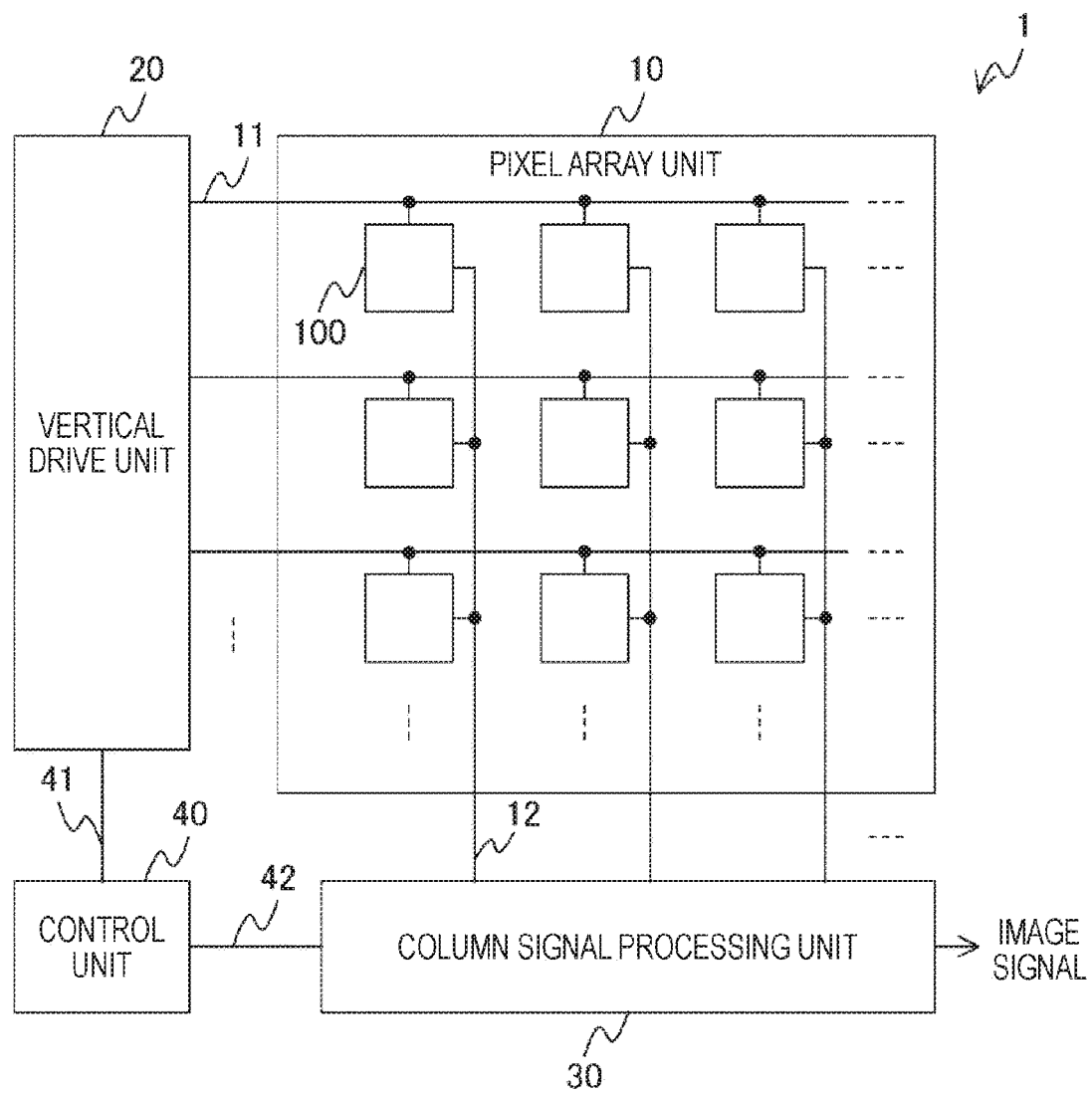
FIG. 1 is a diagram illustrating a configuration example of an imaging element according to an embodiment of the present technology.

Next, a mode for carrying out the present technology (hereinafter, referred to as an embodiment) will be described with reference to the drawings. In the drawings below, the same or similar portions are denoted by the same or similar reference numerals. However, the drawings are schematic, and dimensional ratios and the like of respective portions do not always match actual ones. Furthermore, it goes without saying that portions are included where dimensional relationships and ratios are different between the drawings. Furthermore, embodiments will be described in the following order.

1. First embodiment
2. Second embodiment
3. Third embodiment
4. Fourth embodiment
5. Fifth embodiment
6. Modifications 7. Application example to camera
8. Application example to endoscopic surgical system
9. Application example to mobile body 1. First Embodiment

[Configuration of Imaging Element]

FIG. 1 is a diagram illustrating a configuration example of an imaging element according to an embodiment of the present technology. An imaging element 1 illustrated in the figure includes a pixel array unit 10, a vertical drive unit 20, a column signal processing unit 30, and a control unit 40.

The pixel array unit 10 includes pixels 100 arranged in a two-dimensional lattice. Here, each pixel 100 generates an image signal depending on light emitted thereto. The pixel 100 includes a photoelectric conversion unit that generates charge depending on the light emitted thereto. Furthermore, the pixel 100 further includes a pixel circuit. The pixel circuit generates the image signal based on the charge generated by the photoelectric conversion unit. The generation of the image signal is controlled by a control signal generated by the vertical drive unit 20 described later. In the pixel array unit 10, signal lines 11 and 12 are arranged in an XY matrix. The signal line 11 is a signal line that transmits the control signal for the pixel circuit in the pixel 100, is arranged for each row of the pixel array unit 10, and is commonly wired to the pixels 100 arranged in each row. The signal line 12 is a signal line that transmits the image signal generated by the pixel circuit of the pixel 100, is arranged for each column of the pixel array unit 10, and is commonly wired to the pixels 100 arranged in each column. These photoelectric conversion unit and pixel circuit are formed on a semiconductor substrate.

The vertical drive unit 20 generates the control signal for the pixel circuit of the pixel 100. The vertical drive unit 20 transmits the control signal generated to the pixel 100 via the signal line 11 in the figure. The column signal processing unit 30 processes the image signal generated by the pixel 100. The column signal processing unit 30 processes the image signal transmitted from the pixel 100 via the signal line 12 in the figure. The processing in the column signal processing unit 30 corresponds to, for example, analog-to-digital conversion for converting an analog image signal generated in the pixel 100 into a digital image signal. The image signal processed by the column signal processing unit 30 is output as an image signal of the imaging element 1. The control unit 40 controls the entire imaging element 1. The control unit 40 controls the imaging element 1 by generating and outputting control signals for controlling the vertical drive unit 20 and the column signal processing unit 30. The control signals generated by the control unit 40 are transmitted to the vertical drive unit 20 and the column signal processing unit 30 via signal lines 41 and 42, respectively. Note that, the column signal processing unit 30 is an example of a processing unit described in the claims. The imaging element 1 is an example of an imaging device described in the claims.

[Configuration of Imaging Element]

Figure 2:
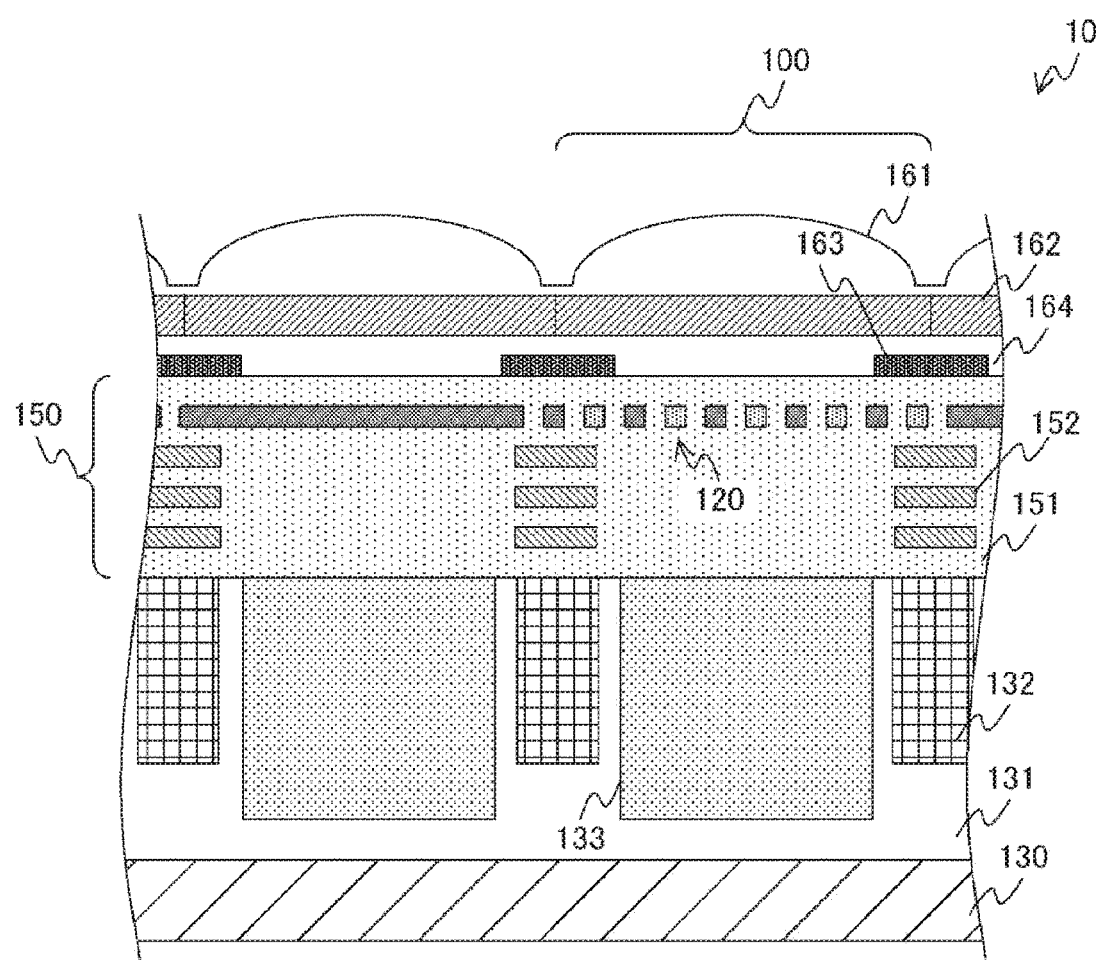
FIG. 2 is a diagram illustrating a configuration example of a pixel according to the embodiment of the present technology.

FIG. 2 is a diagram illustrating a configuration example of the pixel according to the embodiment of the present technology. The figure is a cross-sectional view illustrating a configuration example of the pixel 100. The pixel 100 includes an on-chip lens 161, a color filter 162, a planarizing film 164, a light-shielding film 163, a semiconductor substrate 130, a wiring region 150, and a polarizing unit 120.

The semiconductor substrate 130 is a semiconductor substrate on which semiconductor portions of the photoelectric conversion unit and the pixel circuit of the pixel 100 described in FIG. 1 are formed. Furthermore, on the semiconductor substrate 130, semiconductor portions of the vertical drive unit 20, the column signal processing unit 30, and the control unit 40 are further formed. A p-type well region 131 is formed on the semiconductor substrate 130, and the photoelectric conversion unit and the like of the pixel 100 are formed in the well region 131. The figure illustrates an n-type semiconductor region 133 that constitutes the photoelectric conversion unit. The photoelectric conversion unit generates charge depending on incident light. The details of a configuration of the photoelectric conversion unit will be described later.

Note that, a pixel separation region 132 is arranged between the pixels 100 in the well region 131. The pixel separation region 132 is a region for preventing movement of the charge between the pixels 100.

The wiring region 150 is a region in which a wiring layer 152 and an insulating layer 151 are formed. The wiring layer 152 is a wiring line that transmits the image signal generated in the pixel 100 and the control signal for controlling the pixel circuit. The signal lines 11 and 12 described in FIG. 1 include the wiring layer 152. The wiring layer 152 can include a metal such as copper (Cu). The insulating layer 151 insulates the wiring layers 152 from each other. The insulating layer 151 can include, for example, an oxide such as silicon oxide ($SiO_2$). Note that, the imaging element 1 including the pixel 100 in the figure is a front-illuminated imaging element in which the wiring region 150 is formed on a light incident side of the semiconductor substrate 130.

The on-chip lens 161 is a lens that focuses light from a subject. The color filter 162 is an optical filter that transmits light of a predetermined wavelength of the light focused by the on-chip lens 161. As the color filter 162, for example, the color filter 162 can be used that transmits any of red light, green light, and blue light. The planarizing film 164 is arranged below the color filter 162, and is a film for planarizing the base of the color filter 162. The light-shielding film 163 is a film that shields light obliquely incident from the adjacent pixel 100. The light-shielding film 163 can prevent light transmitted through the color filter 162 of the adjacent pixel 100 from entering, and can prevent the occurrence of color mixing.

The polarizing unit 120 transmits light in a specific polarization direction of the incident light and causes the light to enter the photoelectric conversion unit. The polarizing unit 120 can include a wire grid. Here, the polarizing unit including the wire grid is a polarizing unit including a plurality of lines arranged at a pitch smaller than a wavelength of the incident light. The plurality of lines is formed by a conductive member such as a metal, whereby it is possible to attenuate light polarized in a direction perpendicular to an arrangement direction of the plurality of lines. On the other hand, light polarized in the arrangement direction of the plurality of lines passes through the polarizing unit 120 without being attenuated. As described above, the polarizing unit 120 can transmit the light in the specific polarization direction. Hereinafter, the lines constituting the polarizing unit 120 are referred to as light-shielding lines.

As described above, since the polarizing unit 120 includes an inorganic material having conductivity such as a metal, the polarizing unit 120 can constitute a capacitor. Specifically, the polarizing unit 120 can be used as an electrode of a capacitor using the insulating layer 151 as a dielectric. The polarizing unit 120 in the figure is formed in the wiring region 150 and is connected to the wiring layer 152 and the well region 131, whereby a capacitor can be constituted by the capacitance between the polarizing unit 120 and the facing conductor. At this time, the polarizing unit 120 can be formed simultaneously with the wiring layer 152 by a known method. That is, the polarizing unit 120 can be constituted by lines (light-shielding lines) that includes Cu similarly to the wiring layer 152 and is insulated from each other by the insulating layer 151. Furthermore, it is also possible to arrange an insulator different from the insulating layer 151, for example, air or tantalum pentoxide (Ta2O5), between the lines constituting the polarizing unit 120. The capacitor formed as described above can be used as a second charge holding unit described later. Note that, capacitors are also used in peripheral circuits of the pixel array unit 10 such as the vertical drive unit 20 and the column signal processing unit 30 described in FIG. 1. The capacitors of the peripheral circuits can also be formed simultaneously with the polarizing unit 120 described above.

[Arrangement of Polarizing Unit]

Figure 3:
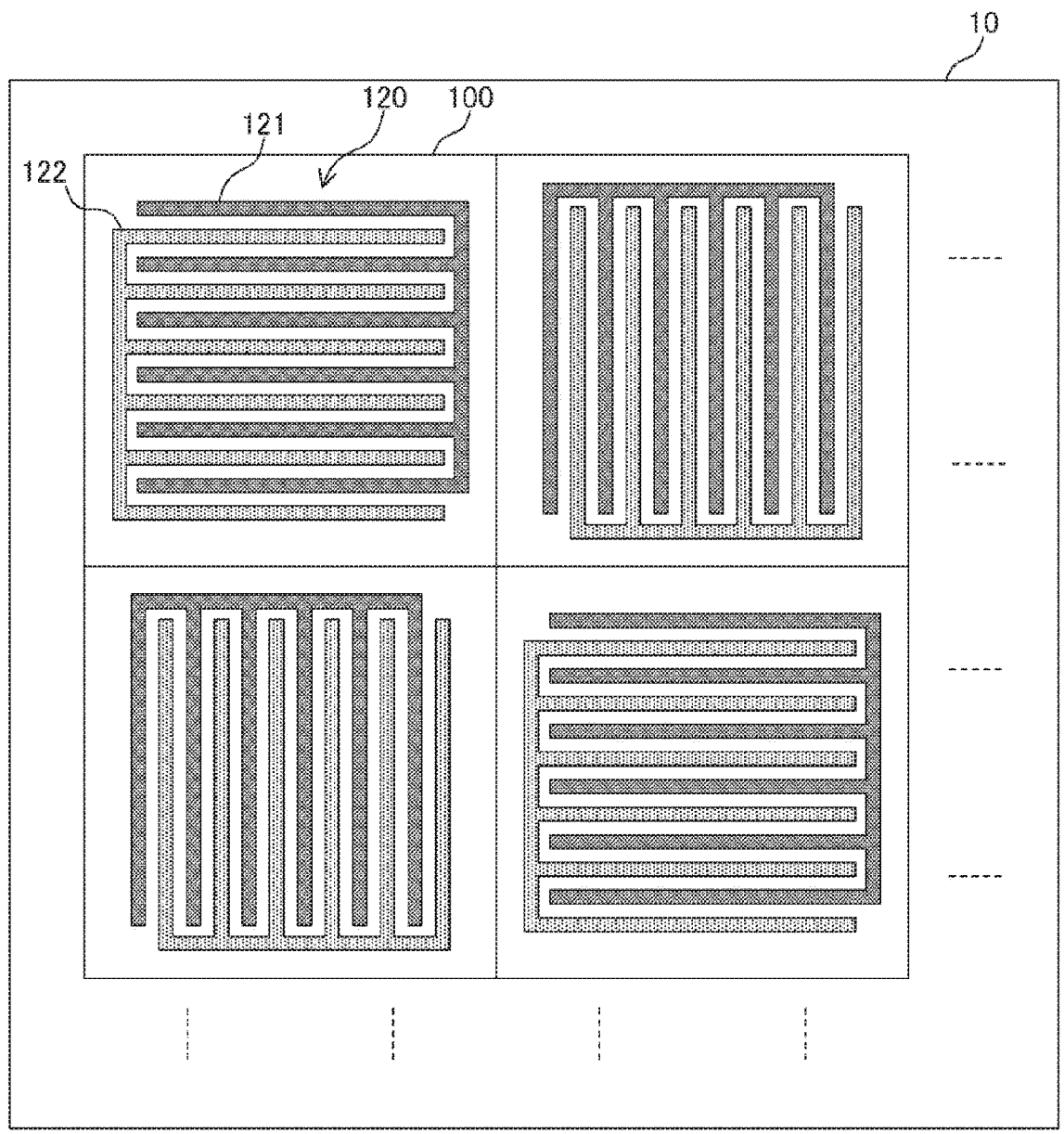
FIG. 3 is a diagram illustrating an arrangement example of a polarizing unit according to a first embodiment of the present technology.

FIG. 3 is a diagram illustrating an arrangement example of the polarizing unit according to a first embodiment of the present technology. The figure is a diagram illustrating an arrangement of the polarizing unit 120 for each pixel 100 in the pixel array unit 10. The polarizing unit 120 illustrated in the figure includes a plurality of light-shielding lines whose one ends are commonly connected and having a comb shape. Furthermore, the plurality of light-shielding lines is drawn out in different directions of the polarizing unit 120 for every other line, and commonly connected together at ends in the respective different directions. The light-shielding lines connected together in comb shapes are used as electrodes of a capacitor. These are identified as electrodes 121 and 122 as illustrated in the figure.

Furthermore, the polarizing unit 120 can be arranged in a different direction for each pixel 100. In the figure, in the adjacent pixels 100, the polarizing units 120 are arranged in which the arrangement directions of the plurality of light-shielding lines are different from each other by 90 degrees. As a result, imaging of the incident light in the different polarization direction is performed for each pixel 100, and polarization information of the subject can be acquired. Note that, the arrangement of the polarizing unit 120 is not limited to this example. For example, it is also possible to use the polarizing unit 120 in which the arrangement direction of the plurality of light-shielding lines is oblique. Furthermore, for example, it is also possible to use the pixels 100 in which the polarizing units 120 are arranged in which the arrangement directions of the plurality of light-shielding lines are different from each other by 45 degrees in the adjacent pixels 100.

[Circuit Configuration of Pixel]

Figure 4:
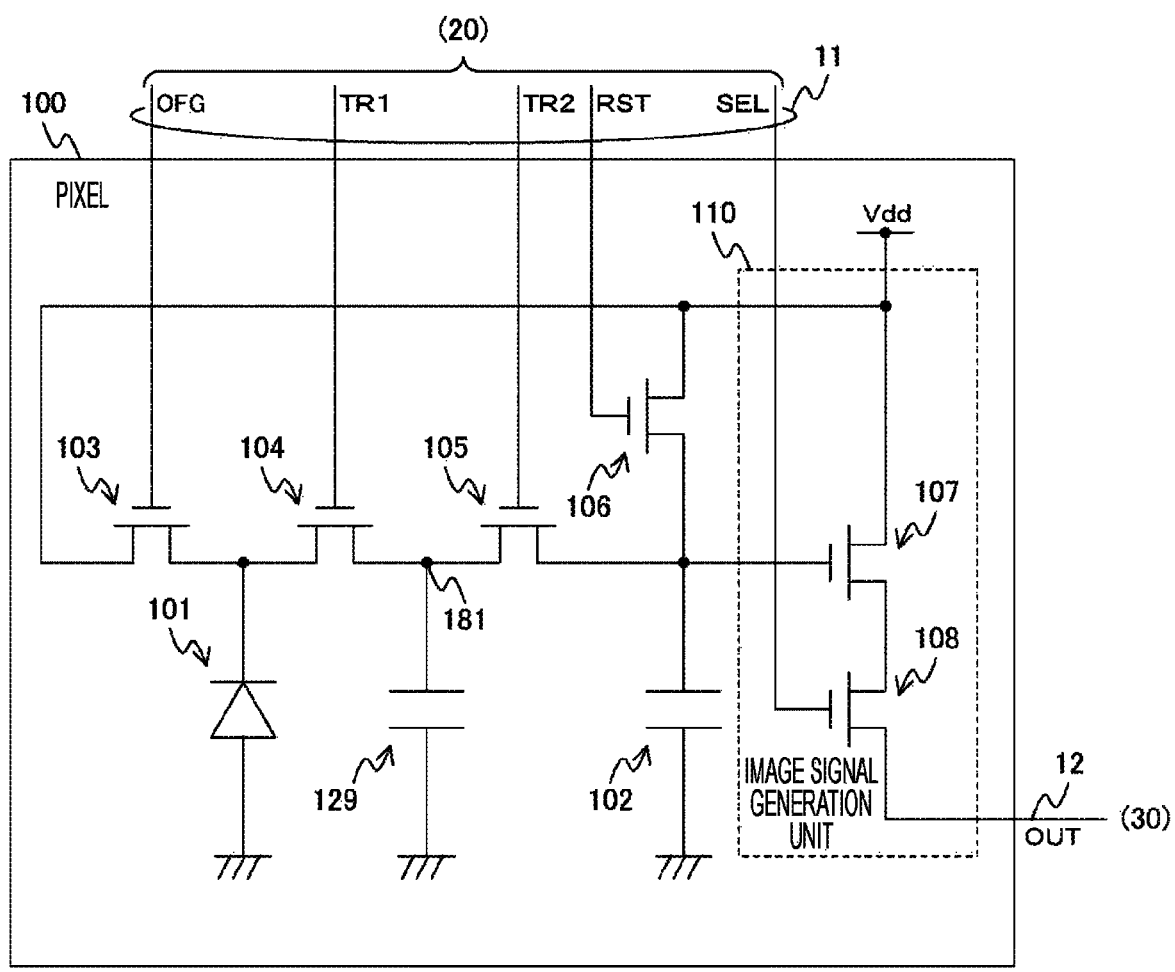
FIG. 4 is a diagram illustrating an example of a circuit configuration of a pixel according to the first embodiment of the present technology.

FIG. 4 is a diagram illustrating an example of a circuit configuration of the pixel according to the first embodiment of the present technology. The figure is a circuit diagram illustrating a configuration of the pixel 100. The pixel 100 in the figure includes a photoelectric conversion unit 101, a first charge holding unit 102, a second charge holding unit 129, and MOS transistors 103 to 108. Furthermore, signal lines OFG, TR1, TR2, RST, SEL, and OUT are wired to the pixel 100. The signal lines OFG, TR1, TR2, RST, and SEL are signal lines that transmit control signals for the pixel 100. These signal lines are connected to the gates of the MOS transistors. A voltage higher than a threshold value between the gate and the source is applied to a MOS transistor through a corresponding one of these signal lines, the MOS transistor can be turned on. The signal lines OFG, TR1, TR2, RST, and SEL constitute the signal line 11. On the other hand, the signal line OUT constitutes the signal line 12, and transmits the image signal generated by the pixel 100. Furthermore, a power supply line Vdd is wired to the pixel 100, and power is supplied.

An anode of the photoelectric conversion unit 101 is grounded, and a cathode is connected to the sources of the MOS transistors 103 and 104. The drain of the MOS transistor 103 is connected to the power supply line Vdd, and the gate is connected to the signal line OFG. The drain of the MOS transistor 104 is connected to the source of the MOS transistor 105 and one end of the second charge holding unit 129. Note that, a node to which the one end of the second charge holding unit 129 is connected is referred to as a node 181. The other end of the second charge holding unit 129 is grounded. The gate of the MOS transistor 104 is connected to the signal line TR1, and the gate of the MOS transistor 105 is connected to the signal line TR2. The drain of the MOS transistor 105 is connected to the source of the MOS transistor 106, the gate of the MOS transistor 107, and one end of the first charge holding unit 102. The other end of the first charge holding unit 102 is grounded. The gate of the MOS transistor 106 is connected to the signal line RST. The drains of the MOS transistors 106 and 107 are commonly connected to the power supply line Vdd, and the source of the MOS transistor 107 is connected to the drain of the MOS transistor 108. The source of the MOS transistor 108 is connected to the signal line OUT, and the gate is connected to the signal line SEL.

The photoelectric conversion unit 101 generates and holds the charge depending on the light emitted thereto as described above. For the photoelectric conversion unit 101, a photodiode can be used.

The MOS transistor 103 is a transistor that resets the photoelectric conversion unit 101. The MOS transistor 103 applies a power supply voltage to the photoelectric conversion unit 101, thereby discharging the charge held in the photoelectric conversion unit 101 to the power supply line Vdd to perform resetting. The reset of the photoelectric conversion unit 101 by the MOS transistor 103 is controlled by a signal transmitted through the signal line OFG.

The MOS transistor 104 is a transistor that transfers the charge generated by photoelectric conversion in the photoelectric conversion unit 101 to the second charge holding unit 129. The transfer of the charge in the MOS transistor 104 is controlled by a signal transmitted through the signal line TR1.

The second charge holding unit 129 is a capacitor that holds the charge transferred by the MOS transistor 104. Note that, the second charge holding unit 129 can include the polarizing unit 120 described above.

The MOS transistor 105 is a transistor that transfers the charge held in the second charge holding unit 129 to the first charge holding unit 102. The transfer of the charge in the MOS transistor 105 is controlled by a signal transmitted through the signal line TR2.

The MOS transistor 107 is a transistor that generates a signal based on the charge held in the first charge holding unit 102. The MOS transistor 108 is a transistor that outputs the signal generated by the MOS transistor 107 to the signal line OUT as an image signal. The MOS transistor 108 is controlled by a signal transmitted through the signal line SEL. Furthermore, the MOS transistors 107 and 108 constitute an image signal generation unit 110.

The MOS transistor 106 is a transistor that resets the first charge holding unit 102 by discharging the charge held in the first charge holding unit 102 to the power supply line Vdd. The reset by the MOS transistor 106 is controlled by a signal transmitted through the signal line RST.

The generation of the image signal in the pixel 100 in the figure can be performed as follows. First, the MOS transistor 103 is turned on to reset the photoelectric conversion unit 101. Next, after a predetermined time has elapsed, the MOS transistors 105 and 106 are turned on to reset the second charge holding unit 129. Next, the MOS transistor 104 is turned on. As a result, the charge generated in the photoelectric conversion unit 101 is transferred to and held by the second charge holding unit 129. The operation from the reset of the photoelectric conversion unit 101 to the transfer of the charge by the MOS transistor 104 is performed simultaneously in all the pixels 100 arranged in the pixel array unit 10. As a result, a global shutter is implemented. Note that, a period from the reset of the photoelectric conversion unit 101 to the transfer of the charge by the MOS transistor 104 corresponds to an exposure period.

Next, the MOS transistor 106 is turned on again to reset the first charge holding unit 102. Next, the MOS transistor 105 is turned on to transfer the charge held in the second charge holding unit 129 to the first charge holding unit 102 and cause the charge to be held therein. As a result, the MOS transistor 107 generates an image signal depending on the charge held in the first charge holding unit 102. Next, the MOS transistor 108 is turned on, whereby the image signal generated by the MOS transistor 107 is output to the signal line OUT. The operation from the reset of the first charge holding unit 102 to the output of the image signal is sequentially performed for each of the pixels 100 arranged in the row of the pixel array unit 10. The image signals in the pixels 100 of all rows of the pixel array unit 10 are output, whereby a frame is generated that is an image signal for one screen, and is output from the imaging element 1.

The generation and output of the image signal in the pixel 100 are performed in parallel with the exposure period described above, whereby the time required for imaging and transferring the image signal can be reduced. Furthermore, all the pixels 100 of the pixel array unit 10 are simultaneously exposed, whereby occurrence of frame distortion can be prevented, and the image quality can be improved. As described above, the second charge holding unit 129 is used to temporarily hold the charge generated by the photoelectric conversion unit 101 when the global shutter is performed.

[Configuration of Pixel]

Figure 5:
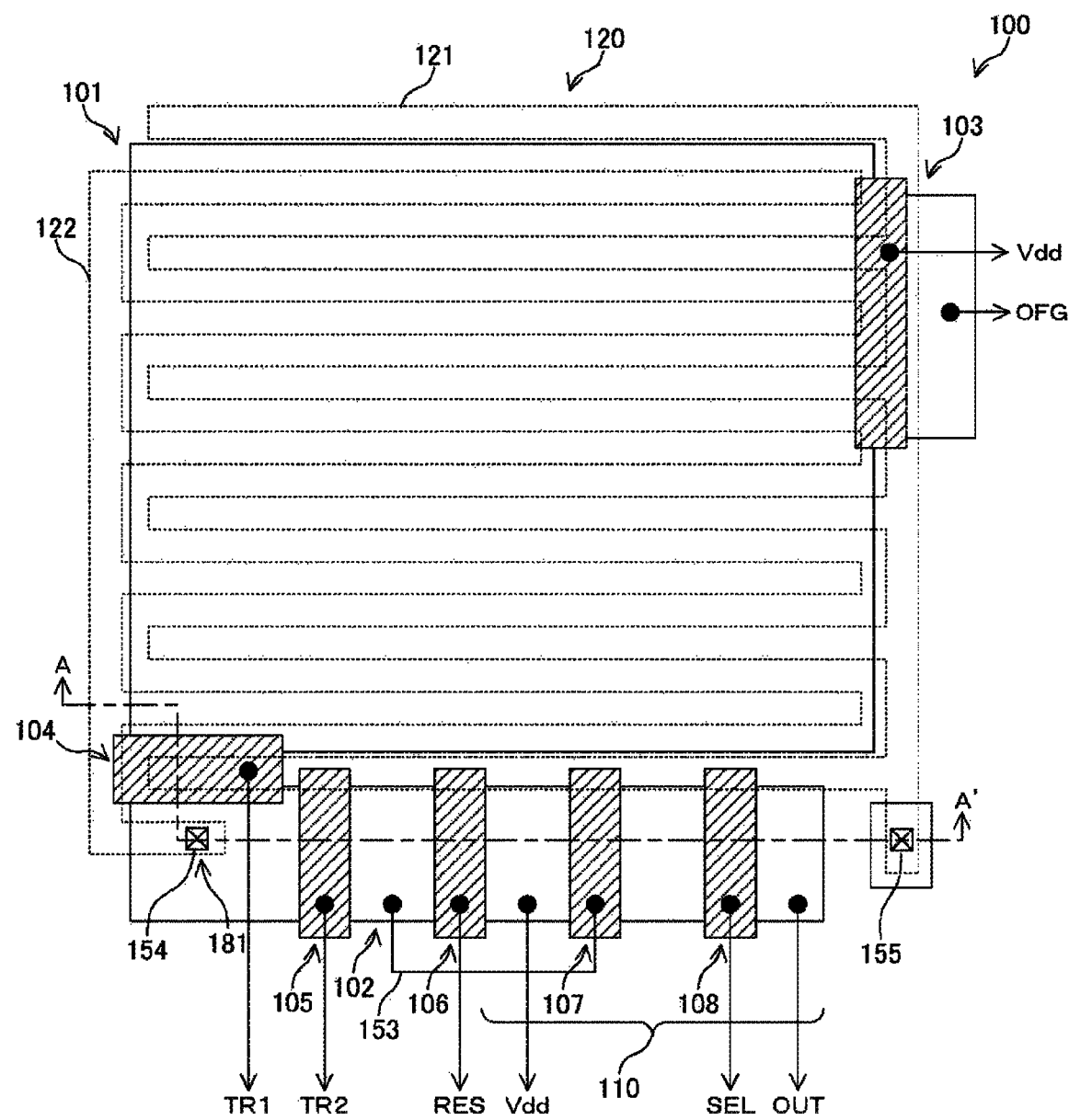
FIG. 5 is a diagram illustrating a configuration example of the pixel according to the first embodiment of the present technology.

FIG. 5 is a diagram illustrating a configuration example of the pixel according to the first embodiment of the present technology. The figure is a diagram illustrating a configuration example of the photoelectric conversion unit 101 and the MOS transistors 103 to 108 described in FIG. 4. In the figure, the hatched rectangles represent the gates of the MOS transistors, and the other solid rectangles represent semiconductor regions formed in the well region 131. Furthermore, regions indicated by broken lines represent the electrodes 121 and 122 of the polarizing unit 120. Furthermore, black circles in the figure represent connections of signal lines. Connection of the wiring line by the wiring layer 152 is made in the region where the black circles are indicated, and the wiring line is connected to the signal line 11 and the like. Note that, signal line names such as TR1 are common to the signal line names described in FIG. 4.

The photoelectric conversion unit 101 is arranged at a central portion of the pixel 100. Gate and drain regions of the MOS transistor 103 are sequentially arranged adjacent to the right side of the photoelectric conversion unit 101. Furthermore, gate and drain regions of the MOS transistor 104 are arranged adjacent to the lower left of the photoelectric conversion unit 101. Gate and drain regions of the MOS transistor 105 are sequentially arranged adjacent to the drain region of the MOS transistor 104. Here, the drain region of the MOS transistor 104 corresponds to a source region of the MOS transistor 105. Gate and drain regions of the MOS transistor 106 are sequentially arranged adjacent to the drain region of the MOS transistor 105. Here, the drain region of the MOS transistor 105 corresponds to a source region of the MOS transistor 106. Gate and source regions of the MOS transistor 107 are sequentially arranged adjacent to the drain region of the MOS transistor 106. Here, the drain region of the MOS transistor 106 corresponds to a drain region of the MOS transistor 107.

Gate and source regions of the MOS transistor 108 are sequentially arranged adjacent to the source region of the MOS transistor 107. Here, the source region of the MOS transistor 107 corresponds to a drain region of the MOS transistor 108. The drain region of the MOS transistor 105 is connected to the gate of the MOS transistor 107 by a signal line 153. Furthermore, the drain region of the MOS transistor 105 corresponds to the first charge holding unit 102 described in FIG. 4.

The electrode 121 of the polarizing unit 120 is connected at an end to the well region 131 by a contact plug 155. The region to which the contact plug 155 is connected constitutes a well contact, and the electrode 121 is grounded. Furthermore, the electrode 122 of the polarizing unit 120 is connected at an end to the drain region of the MOS transistor 104 by a contact plug 154. The connection portion corresponds to the node 181 described in FIG. 4. As described above, the electrodes 122 and 121 are respectively connected to regions having different potentials. A capacitor formed by the electrodes 122 and 121 can be used as the second charge holding unit 129. Note that, the configuration of the pixel 100 is not limited to this example. For example, it is also possible to use a capacitor formed between the electrode (electrodes 122 and 121) constituting the polarizing unit 120 and another electrode (such as a wiring line) for the charge holding unit and the like.

[Configuration of Pixel]

Figure 6:
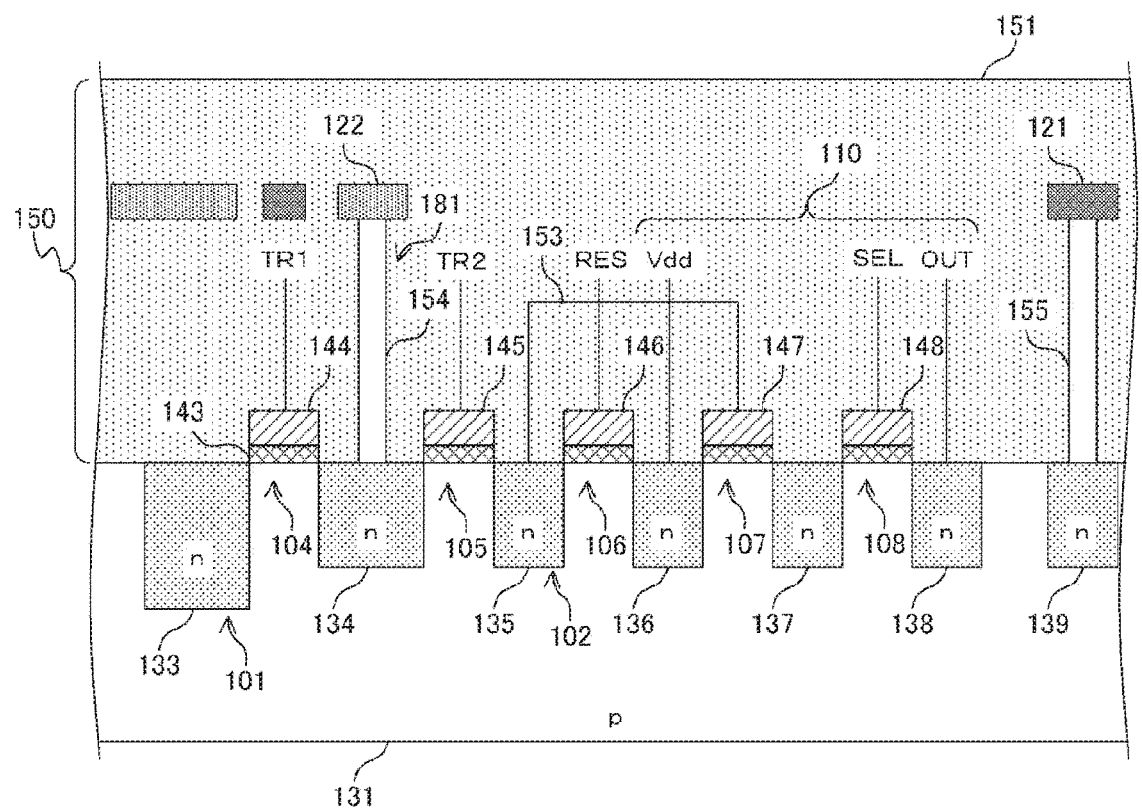
FIG. 6 is a cross-sectional view illustrating the configuration example of the pixel according to the first embodiment of the present technology.

FIG. 6 is a cross-sectional view illustrating the configuration example of the pixel according to the first embodiment of the present technology. The figure is a diagram illustrating a configuration example of the well region 131 and the wiring region 150 of the pixel 100, and is a cross-sectional view along the line A-A' in FIG. 5. In the well region 131 in the figure, n-type semiconductor regions 133 to 139 are formed. Note that, signal line names such as TR1 are common to the signal line names described in FIG. 4.

The photoelectric conversion unit 101 includes the n-type semiconductor region 133 and the p-type well region 131 around the n-type semiconductor region 133. At a pn junction formed at an interface between the n-type semiconductor region 133 and the well region 131, photoelectric conversion depending on the incident light is performed, and the charge generated by the photoelectric conversion is held in the n-type semiconductor region 133.

The MOS transistor 104 is a MOS transistor in which the n-type semiconductor regions 133 and 134 are source and drain regions, respectively, and the well region 131 between the n-type semiconductor regions 133 and 134 is a channel region. A gate 144 of the MOS transistor 104 is arranged adjacent to the channel region with a gate insulating film 143 interposed therebetween. Similarly, the MOS transistor 105 includes the n-type semiconductor regions 134 and 135 and a gate 145. The MOS transistor 106 includes the n-type semiconductor regions 135 and 136 and a gate 146. The MOS transistor 107 includes the n-type semiconductor regions 137 and 136 and a gate 147. The MOS transistor 108 includes the n-type semiconductor regions 138 and 137 and a gate 148. Note that, the n-type semiconductor region 135 corresponds to floating diffusion, and constitutes the first charge holding unit 102. The n-type semiconductor region 135 has a relatively deep potential, and holds charge.

The n-type semiconductor region 139 constitutes the well contact. The electrode 121 constituting the polarizing unit 120 is connected to the n-type semiconductor region 139 by the contact plug 155 and is grounded. On the other hand, the electrode 122 constituting the polarizing unit 120 is connected to the n-type semiconductor region 134, that is, the drain region of the MOS transistor 104 with the contact plug 154 interposed therebetween. As a result, the charge generated by the photoelectric conversion unit 101 can be held in the capacitance between the electrodes 121 and 122 formed in comb shapes. For this reason, arrangement can be omitted of a new capacitor for the global shutter. Note that, for the contact plug, for example, tungsten (W) or Cu can be used.

As described above, in the imaging element 1 of the first embodiment of the present technology, the electrodes of the polarizing unit 120 are used as the charge holding unit, whereby the configuration of the pixel 100 can be simplified.

2. Second Embodiment

The imaging element 1 of the first embodiment described above uses the polarizing unit 120 including the light-shielding lines including a single metal or the like. On the other hand, the imaging element 1 of a second embodiment of the present technology differs from the first embodiment described above in that the polarizing unit 120 is used including a light-shielding line having a three-layer structure.

[Configuration of Polarizing Unit]

Figure 7:
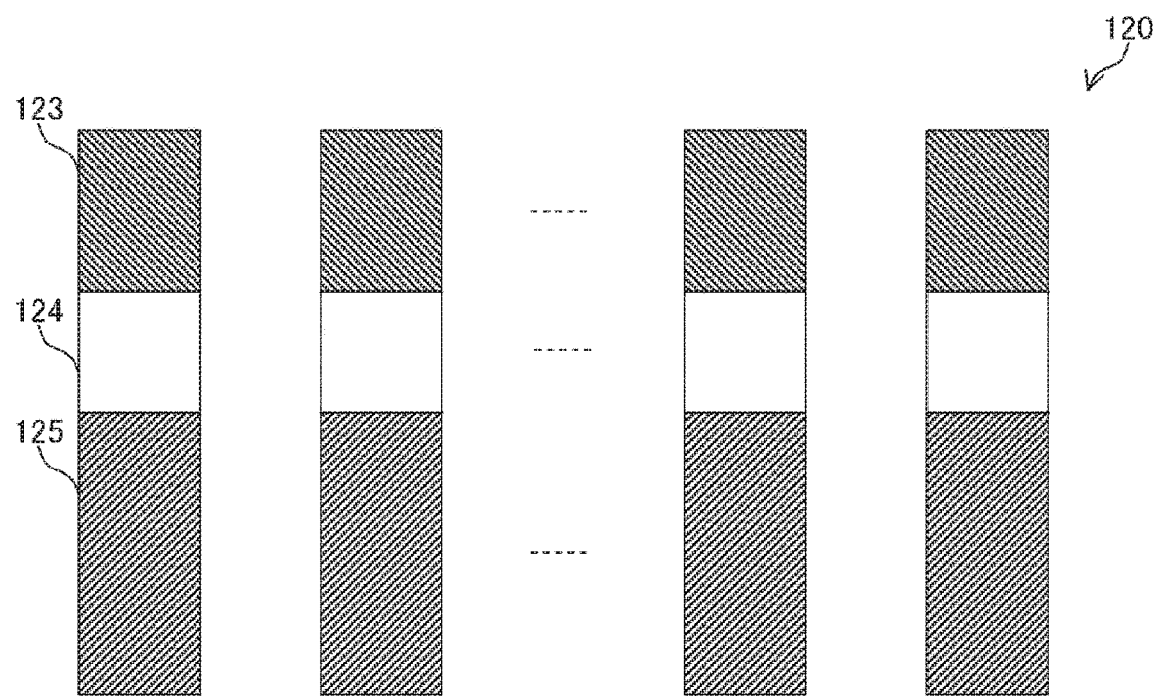
FIG. 7 is a diagram illustrating a configuration example of a polarizing unit 120 according to a second embodiment of the present technology.

FIG. 7 is a diagram illustrating a configuration example of the polarizing unit 120 according to the second embodiment of the present technology. The polarizing unit 120 illustrated in the figure differs from the polarizing unit 120 described in FIG. 2 in that the polarizing unit 120 includes the light-shielding line having the three-layer structure. The light-shielding line constituting the polarizing unit 120 in the figure includes a light reflecting layer 125, an insulating layer 124, and a light absorbing layer 123 sequentially laminated.

The light reflecting layer 125 reflects light. The light reflecting layer 125 can include an inorganic material having conductivity similarly to the light-shielding line described in FIG. 2. For example, the light reflecting layer 125 can include a metal material such as aluminum (Al), silver (Ag), gold (Au), Cu, platinum (Pt), molybdenum (Mo), chromium (Cr), titanium (Ti), nickel (Ni), W, iron (Fe), and tellurium (Te), or an alloy thereof. Furthermore, the light reflecting layer 125 can also include a semiconductor such as silicon (Si) or germanium (Ge).

The insulating layer 124 insulates the light reflecting layer 125 and the light absorbing layer 123 from each other. For the insulating layer 124, a material can be used that does not have light absorption property for incident light. For example, it is possible to use silicon oxide and nitride such as $SiO_2$ and SiN, glass such as Borosilicate glass (BSG) and Boron Phosphorus Silicate Glass (BPSG), and resin.

The light absorbing layer 123 absorbs light. The light absorbing layer 123 can include a metal material, an alloy material, and a semiconductor material having a light absorbing function. For example, the light absorbing layer 123 can include a metal material such as Al, Ag, Au, Cu, Mo, Cr, Ti, Ni, W, Fe, Te, and tin (Sn), or an alloy thereof. Furthermore, the light absorbing layer 123 can also include a semiconductor material such as Si or Ge. Note that, it is necessary to select a material having an absorbing function for light of a desired wavelength for the light absorbing layer 123. The light absorbing layer 123 is arranged, whereby reflection of light from the polarizing unit 120 can be reduced.

As described above, the polarizing unit 120 of the second embodiment of the present technology has a three-layer structure in which the light reflecting layer 125 and the light absorbing layer 123 that are two conductor layers sandwich the insulating layer 124. The light-shielding line 120 having the three-layer configuration is used, whereby light-shielding ability can be improved.

Since the light reflecting layer 125 and the light absorbing layer 123 include a material having conductivity, they can be used as electrodes of a capacitor such as the second charge holding unit 129 described in FIG. 4. Specifically, a capacitor can be constituted in which the light reflecting layer 125 and the light absorbing layer 123 are used as electrodes and the insulating layer 124 is used as a dielectric.

[Connection Method of Polarizing Unit]

Figure 8A:
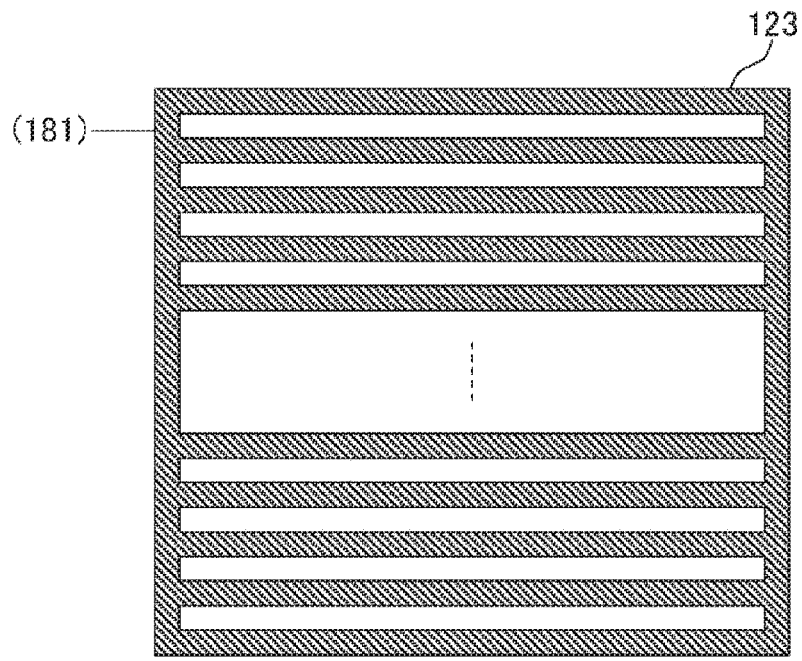
FIGS. 8A and 8B are diagrams illustrating an example of connection of electrodes of the polarizing unit according to the second embodiment of the present technology.
Figure 8B:
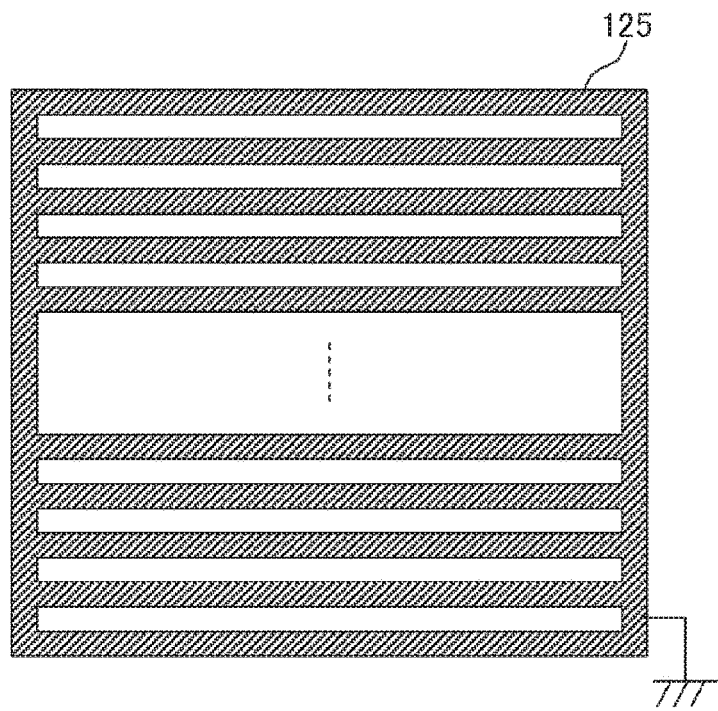

FIGS. 8A and 8B are diagrams illustrating an example of connection of the electrodes of the polarizing unit according to the second embodiment of the present technology. In the FIGS. 8A and 8B are diagrams illustrating connection methods of the light absorbing layer 123 and the light reflecting layer 125, respectively. As illustrated in the figure, the light absorbing layer 123 is connected to the node 181 and the light reflecting layer 125 is grounded, whereby the polarizing unit 120 can be used as the second charge holding unit 129. Note that, it is not necessary to constitute the polarizing unit 120 in the comb shape described above in FIG. 3. Note that, it is also possible to ground the light absorbing layer 123, and connect the light reflecting layer 125 to the node 181. As described above, in the polarizing unit 120 in the figure, the light absorbing layer 123 and the light reflecting layer 125 are charged to the same potential in the adjacent light-shielding lines. Note that, the light absorbing layer 123 and the light reflecting layer 125 are examples of conductor layers described in the claims.

[Method of Manufacturing Polarizing Unit]

Figure 9A:
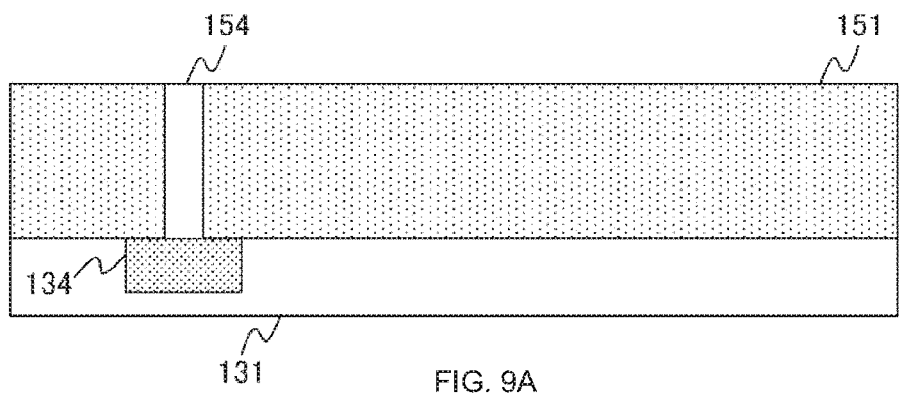
FIGS. 9A, 9B, and 9C are diagrams illustrating an example of a method of manufacturing the polarizing unit according to the second embodiment of the present technology.

FIGS. 9A, 9B, 9C, 10A, 10B, and 10C are diagrams illustrating an example of a method of manufacturing the polarizing unit according to the second embodiment of the present technology. First, the n-type semiconductor region 134 and the like are formed in the well region 131 of the semiconductor substrate 130, and the insulating layer 151 is formed. A hole is formed in the insulating layer 151 and W or the like is embedded to form a contact plug 154 (FIG. 9A).

Figure 9B:
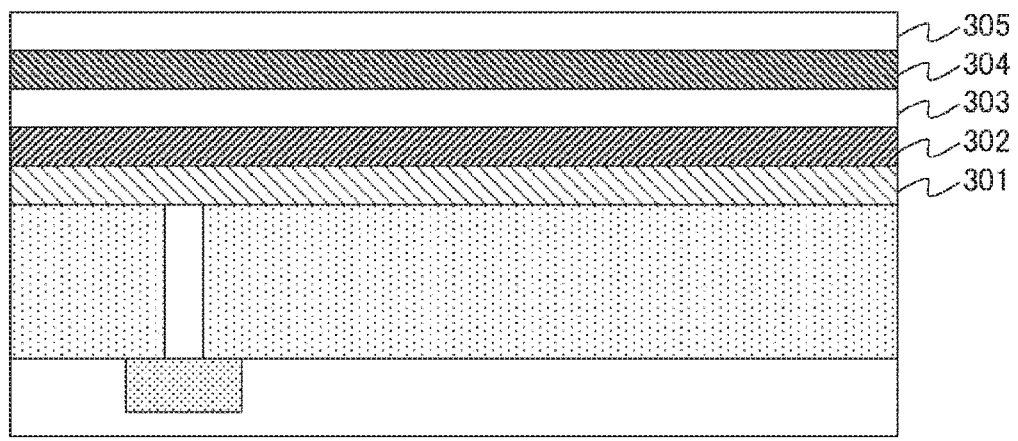
Figure 9C:
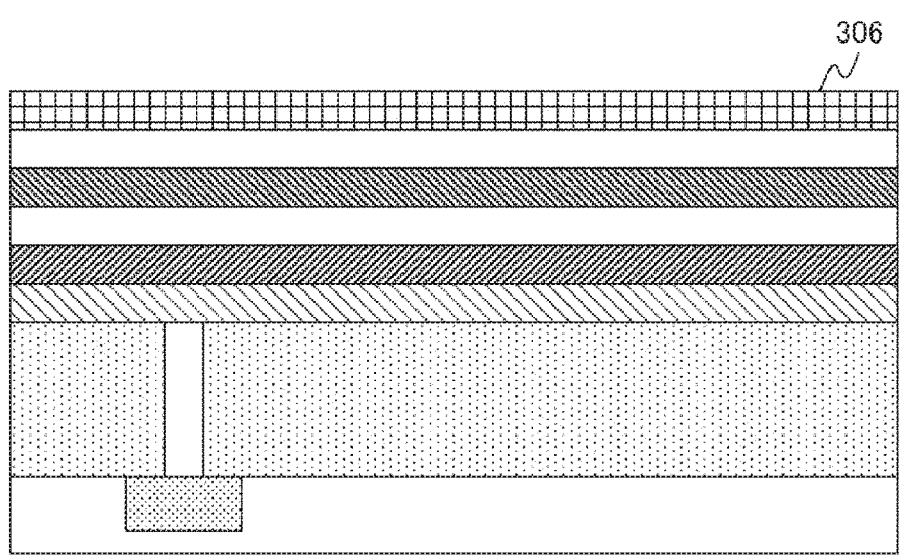

Next, a base metal layer 301 such as titanium nitride (TiN), a first metal layer 302 such as Al, an insulating layer 303 such as SiO2, a second metal layer 304 such as W, and a hard mask layer 305 such as SiO2 are laminated in order. The first metal layer 302 and the second metal layer 304 are metal layers respectively constituting the light reflecting layer 125 and the light absorbing layer 123. The base metal layer 301 is a film that improves adhesion between the first metal layer 302 and the insulating layer 151. The hard mask layer 305 is a film that protects the light reflecting layer 125 and the light absorbing layer 123 at the time of etching described later. The base metal layer 301, the first metal layer 302, and the second metal layer 304 can be formed by, for example, sputtering. The insulating layer 303 and the hard mask layer 305 can be formed by, for example, Chemical Vapor Deposition (CVD) (FIG. 9B).

Figure 10A:
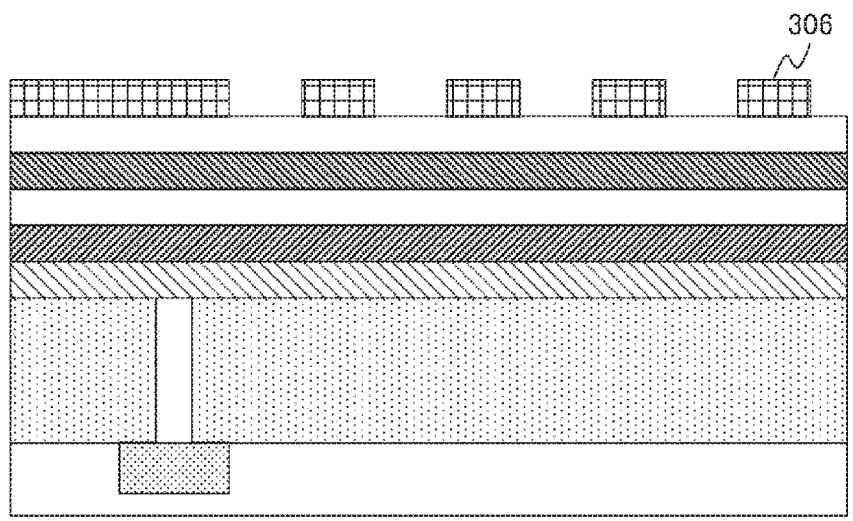
FIGS. 10A, 10B, and 10C are diagrams illustrating the example of the method of manufacturing the polarizing unit according to the second embodiment of the present technology.
Figure 10B:
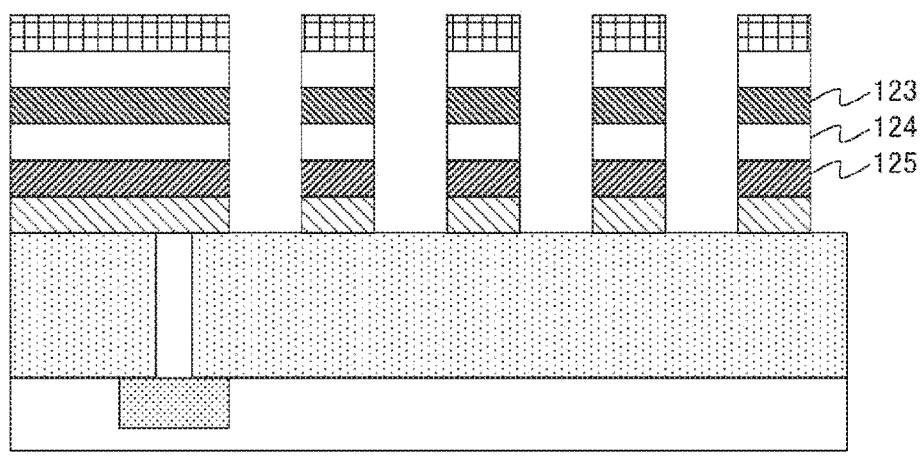
Figure 10C:
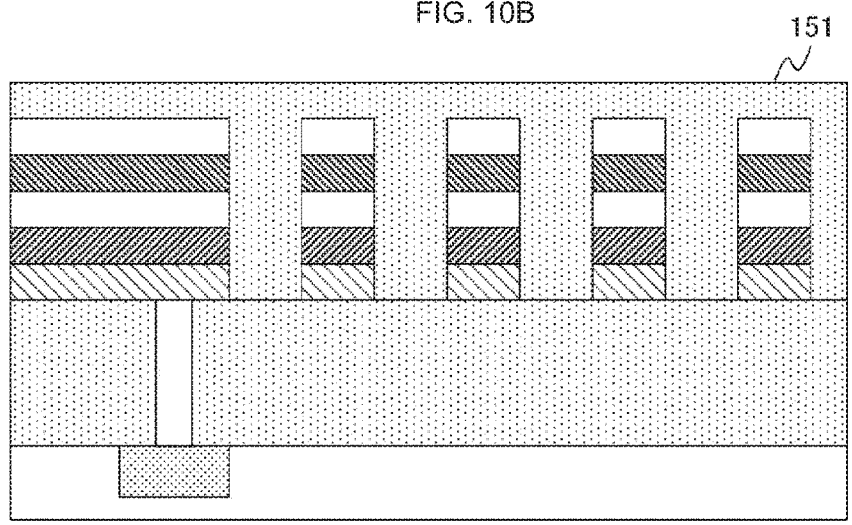

Next, a resist 306 is applied (FIG. 9C), and patterning is performed (FIG. 10A). Next, etching is performed using the resist 306 subjected to the patterning as a mask to form a light-shielding line. The etching can be performed by, for example, dry etching. As a result, the light reflecting layer 125, the insulating layer 124, and the light absorbing layer 123 can be formed (FIG. 10B). Next, the resist 306 is removed, and the insulating layer 151 is laminated to fill the space between the light-shielding lines with an insulating material (FIG. 10C). Through the processes described above, it is possible to manufacture the polarizing unit 120 and connect the light reflecting layer 125 to the n-type semiconductor region 134 of the well region 131 with the base metal layer 301 and the contact plug 154 interposed therebetween. In the polarizing unit 120 in the figure, the base metal layer 301 is used as a part of the electrode of the polarizing unit 120. The base metal layer 301 can be omitted.

The configuration of the imaging element 1 other than the above is similar to the configuration of the imaging element 1 described in the first embodiment of the present technology, and a description thereof will not be repeated.

As described above, in the imaging element 1 of the second embodiment of the present technology, the insulating layer 124 is used as the dielectric and the light absorbing layer 123 and the light reflecting layer 125 are used as electrodes in the light-shielding line having the three-layer structure, whereby the capacitor can be constituted.

3. Third Embodiment

In the imaging element 1 of the second embodiment described above, a region sandwiched between the light absorbing layer 123 and the light reflecting layer 125 arranged on the same light-shielding line is used as a capacitor. On the other hand, the imaging element 1 of a third embodiment of the present technology differs from the second embodiment described above in that a region sandwiched between adjacent light-shielding lines is used as a capacitor.

[Connection Method of Polarizing Unit]

Figure 11A:
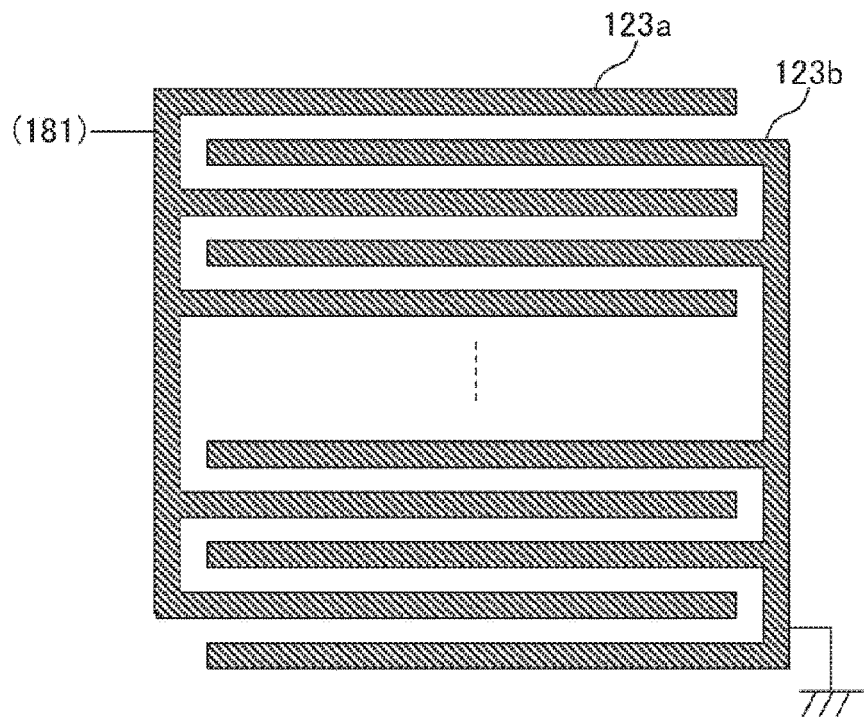
FIGS. 11A and 11B are diagrams illustrating an example of connection of electrodes of a polarizing unit according to a third embodiment of the present technology.
Figure 11B:
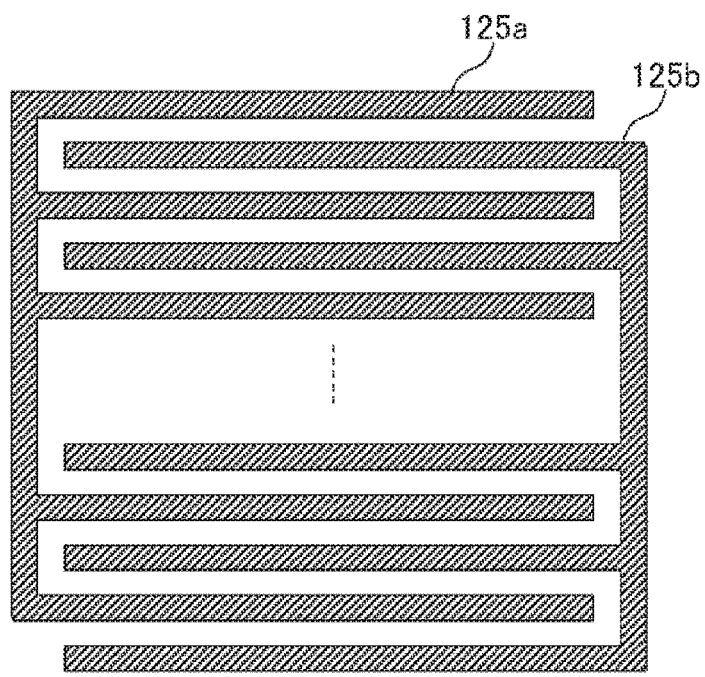

FIGS. 11A and 11B are diagrams illustrating an example of connection of electrodes of a polarizing unit according to the third embodiment of the present technology. The connection differs from that of the polarizing unit 120 described in FIGS. 8A and 8B in that the light absorbing layer 123 and the light reflecting layer 125 in the figure are formed in the comb shapes as described above in FIG. 3, and the region between the adjacent light-shielding lines is used as a capacitor. In the figure, FIG. 11A represents the connection of the light absorbing layer 123, and FIG. 11B represents the connection of the light reflecting layer 125.

In a in the figure, of two light absorbing layers 123a and 123b formed in the comb shapes, the light absorbing layer 123a is connected to the node 181 and the light absorbing layer 123b is grounded. As a result, a capacitor can be constituted including the light absorbing layer 123a and the light absorbing layer 123b as electrodes. On the other hand, in b in the figure, two light reflecting layers 125a and 125b constituted in the comb shape are set in a floating state. A capacitor including the light absorbing layer 123a and the light reflecting layer 125a as electrodes, a capacitor including the light reflecting layers 125a and 125b as electrodes, and a capacitor including the light reflecting layer 125b and the light absorbing layer 123b as electrodes connected in series are formed. These three capacitors are connected together in series, and are connected in parallel to the capacitor including the light absorbing layer 123a and the light absorbing layer 123b as electrodes. For this reason, the capacitance of the capacitor can be increased as compared with the polarizing unit 120 described in FIG. 3.

Figure 12A:
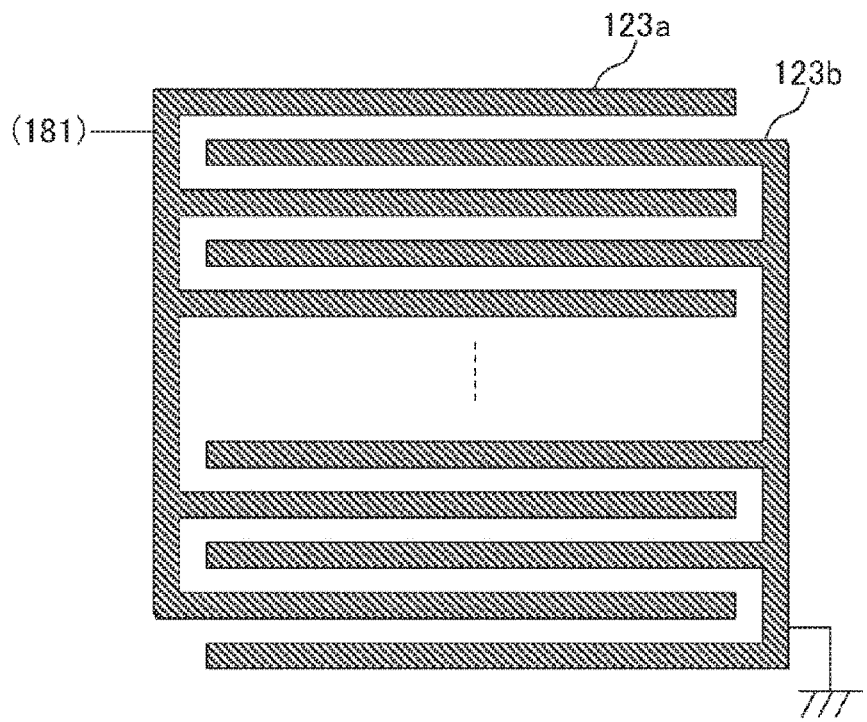
FIGS. 12A and 12B are diagrams illustrating another example of the connection of the electrodes of the polarizing unit according to the third embodiment of the present technology.
Figure 12B:
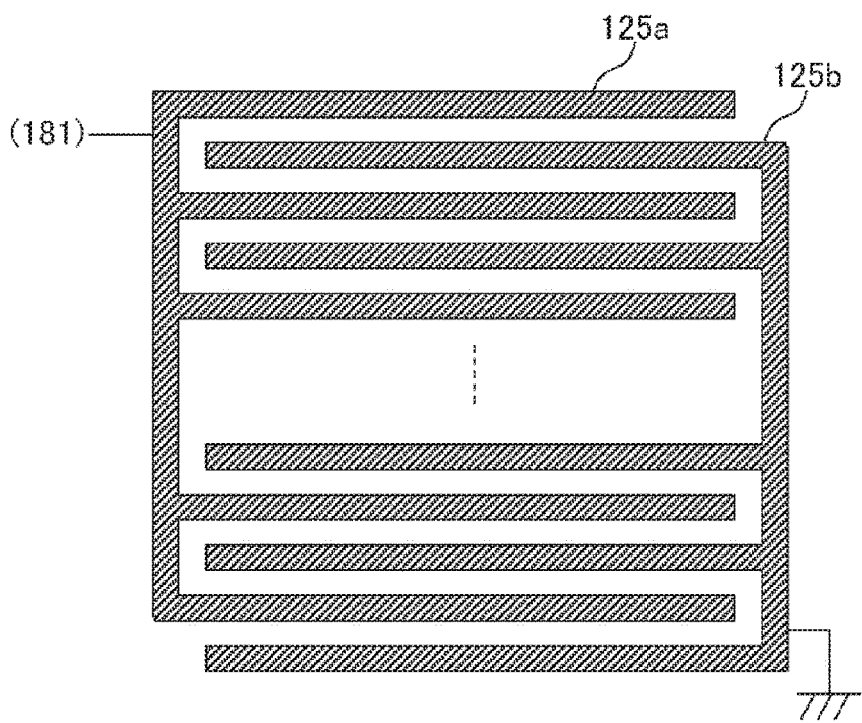

FIGS. 12A and 12B are diagrams illustrating another example of the connection of the electrodes of the polarizing unit according to the third embodiment of the present technology. The polarizing unit 120 in the figure differs from the polarizing unit 120 illustrated in FIGS. 11A and 11B in that connection of the light reflecting layer 125 is performed. In FIG. 12B, the light reflecting layer 125a is connected to the node 181 and the light reflecting layer 125b is grounded. The connection of the light absorbing layer 123 in FIG. A is made similar to that in FIG. 11A. As a result, the capacitor including the light reflecting layers 125a and 125b as electrodes is connected in parallel to the capacitor including the light absorbing layers 123a and 123b as electrodes. The capacitance of the capacitor can be increased as compared with the polarizing unit 120 of FIGS. 11A and 11B.

As described above, in the polarizing unit 120 illustrated in FIGS. 11A, 11B, 12A, and 12B, the light absorbing layer 123 and the light reflecting layer 125 are charged to different potentials in the adjacent light-shielding lines.

Note that, the connection methods of the light absorbing layer 123 and the light reflecting layer 125 are not limited to this example. For example, in FIGS. 11A, 11B, 12A, and 12B, connection can be adopted in which connection destinations of the light absorbing layer 123 and the light reflecting layer 125 are switched.

The configuration of the imaging element 1 other than the above is similar to the configuration of the imaging element 1 described in the second embodiment of the present technology, and a description thereof will not be repeated.

As described above, in the imaging element 1 of the third embodiment of the present technology, in the polarizing unit 120 including the light-shielding lines having the three-layer structure, the capacitor can be constituted by the adjacent light-shielding lines.

4. Fourth Embodiment

In the imaging element 1 of the third embodiment described above, the region sandwiched between the adjacent light-shielding lines is used as the capacitor. On the other hand, the imaging element 1 of a fourth embodiment of the present technology differs from the third embodiment described above in that a capacitor in a region sandwiched between the light absorbing layer 123 and the light reflecting layer 125 arranged on the same light-shielding line is further used.

[Connection Method of Polarizing Unit]

Figure 13A:
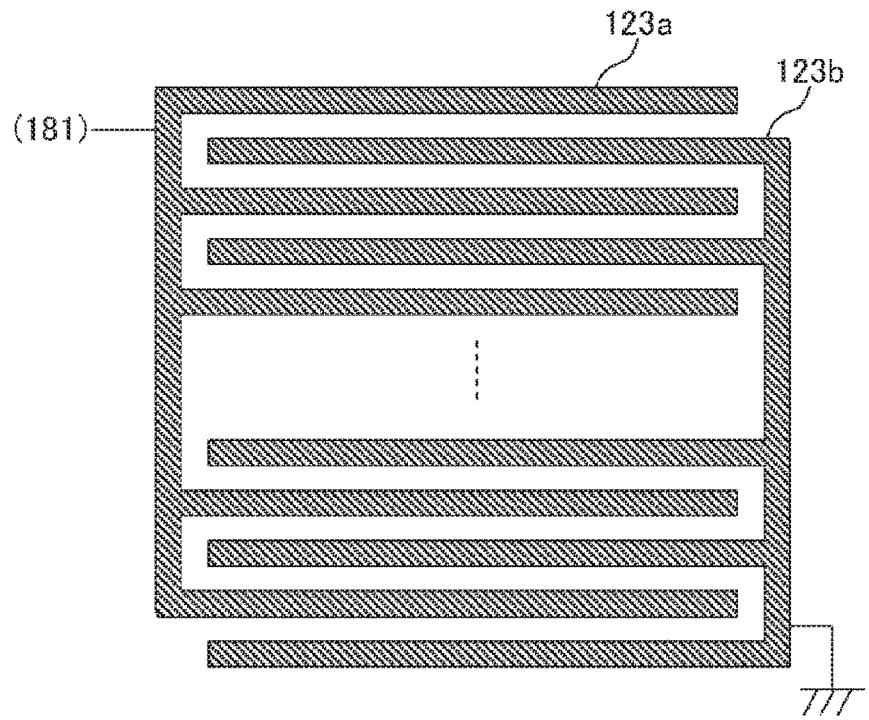
FIGS. 13A and 13B are diagrams illustrating an example of connection of electrodes of a polarizing unit according to a fourth embodiment of the present technology.
Figure 13B:
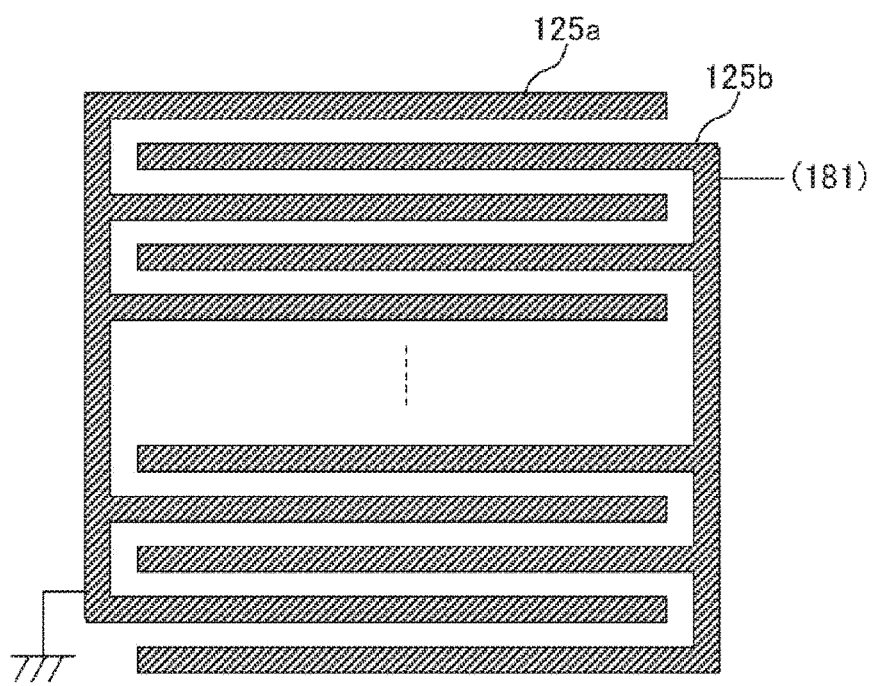

FIGS. 13A and 13B are diagrams illustrating an example of connection of electrodes of a polarizing unit according to the fourth embodiment of the present technology. In the figure, FIG. 13A represents the connection of the light absorbing layer 123, and FIG. 13B represents the connection of the light reflecting layer 125. The polarizing unit 120 in the figure differs from the polarizing unit 120 described in FIGS. 12A and 12B in that the light absorbing layer 123 and the light reflecting layer 125 are charged to different potentials in the same light-shielding line and the adjacent light-shielding line.

The connection of the light absorbing layer 123 in FIG. 13A in the figure is similar to the connection in FIG. 11A. On the other hand, as illustrated in FIG. 13B in the figure, the light reflecting layer 125*a* is grounded, and the light reflecting layer 125*b* is connected to the node 181. That is, in the polarizing unit 120 in the figure, a capacitor between the light absorbing layer 123 and the light reflecting layer 125 in the same light-shielding line and a capacitor between the light absorbing layer 123 and the light reflecting layer 125 in the adjacent light-shielding line are connected in parallel to each other. As a result, the capacitance of the capacitor can be further increased.

Note that, the connection methods of the light absorbing layer 123 and the light reflecting layer 125 are not limited to this example. For example, in FIGS. 13A and 13B, connection can be adopted in which connection destinations of the light absorbing layer 123 and the light reflecting layer 125 are switched.

The configuration of the imaging element 1 other than the above is similar to the configuration of the imaging element 1 described in the third embodiment of the present technology, and a description thereof will not be repeated.

As described above, in the imaging element 1 of the fourth embodiment of the present technology, in the polarizing unit 120 including the light-shielding lines having the three-layer structure, the capacitors can be used that are constituted by the light absorbing layer 123 and the light reflecting layer 125 of the same light-shielding line and the adjacent light-shielding line. As a result, the capacitance of the capacitor can be increased.

5. Fifth Embodiment

In the imaging element 1 of the first embodiment described above, the second charge holding unit 129 is used as a charge holding unit for the global shutter. On the other hand, the imaging element 1 of a fifth embodiment of the present technology differs from the first embodiment described above in that the second charge holding unit 129 is used for adjusting sensitivity of the pixel 100.

[Circuit Configuration of Pixel]

Figure 14:
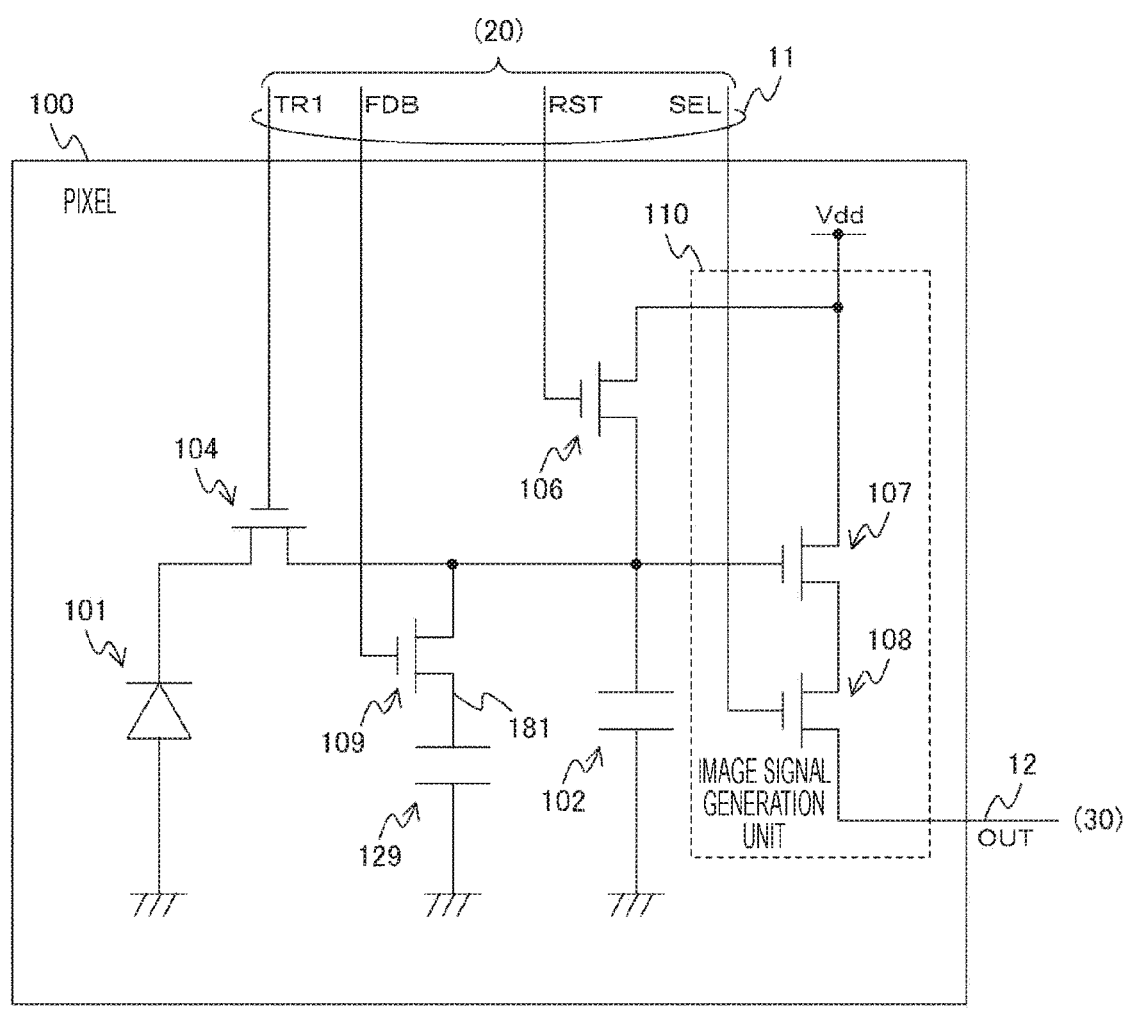

FIG. 14 is a diagram illustrating an example of a circuit configuration of the pixel according to the fifth embodiment of the present technology. The figure is a circuit diagram illustrating a configuration of the pixel 100. The pixel 100 in the figure differs from the pixel 100 described in FIG. 4 in that the MOS transistors 103 and 105 are omitted and a MOS transistor 109 is included. Furthermore, the pixel 100 in the figure includes a signal line FDB instead of the signal lines OFG and TR2.

In the figure, the drain of the MOS transistor 104 is connected to the drain of the MOS transistor 109, the source of the MOS transistor 106, the gate of the MOS transistor 107, and one end of the first charge holding unit 102. The gate of the MOS transistor 109 is connected to the signal line FDB, and the source is connected to one end of the second charge holding unit 129. The other end of the second charge holding unit 129 is grounded. Note that, in the figure, a connection node between the MOS transistor 109 and the second charge holding unit 129 is the node 181. The configuration of the pixel 100 other than the above is similar to that of the pixel 100 described in FIG. 4, and a description thereof will not be repeated.

The MOS transistor 109 is a transistor that makes the node 181 and the one end of the first charge holding unit 102 conductive. Furthermore, the MOS transistor 109 is controlled by a signal transmitted through the signal line FDB. As described above, the second charge holding unit 129 in the Figure is connected in parallel to the first charge holding unit 102 with the MOS transistor 109 interposed therebetween on the basis of the signal transmitted through the signal line FDB. As a result, the apparent capacitance can be changed of the first charge holding unit 102 that holds the charge generated by the photoelectric conversion unit 101.

In a state in which the MOS transistor 109 is turned off, only the first charge holding unit 102 is connected to the drain of the MOS transistor 104. The capacitance for holding the charge generated by the photoelectric conversion unit 101 is comparatively decreased, and the sensitivity is increased of when an image signal is generated from the charge generated by the photoelectric conversion unit 101. However, since the capacitance of the first charge holding unit 102 is low, in a case where the charge is excessively generated by the photoelectric conversion unit 101, saturation occurs, and the image quality is reduced. In such a case, the MOS transistor 109 is turned on, the second charge holding unit 129 is connected in parallel to the first charge holding unit 102, and the apparent capacitance of the first charge holding unit 102 is increased. As a result, the sensitivity of the pixel 100 is decreased, and the saturation of the image signal can be prevented.

That is, in a low illuminance environment, imaging is performed with the pixel 100 having high sensitivity by turning off the MOS transistor 109. In an environment with high illuminance, the MOS transistor 109 is turned on to decrease the sensitivity of the pixel 100, and imaging is performed while preventing the saturation of the image signal. As described above, imaging is performed by changing the sensitivity of the pixel 100, whereby the image quality can be improved.

[Configuration of Pixel]

Figure 15:
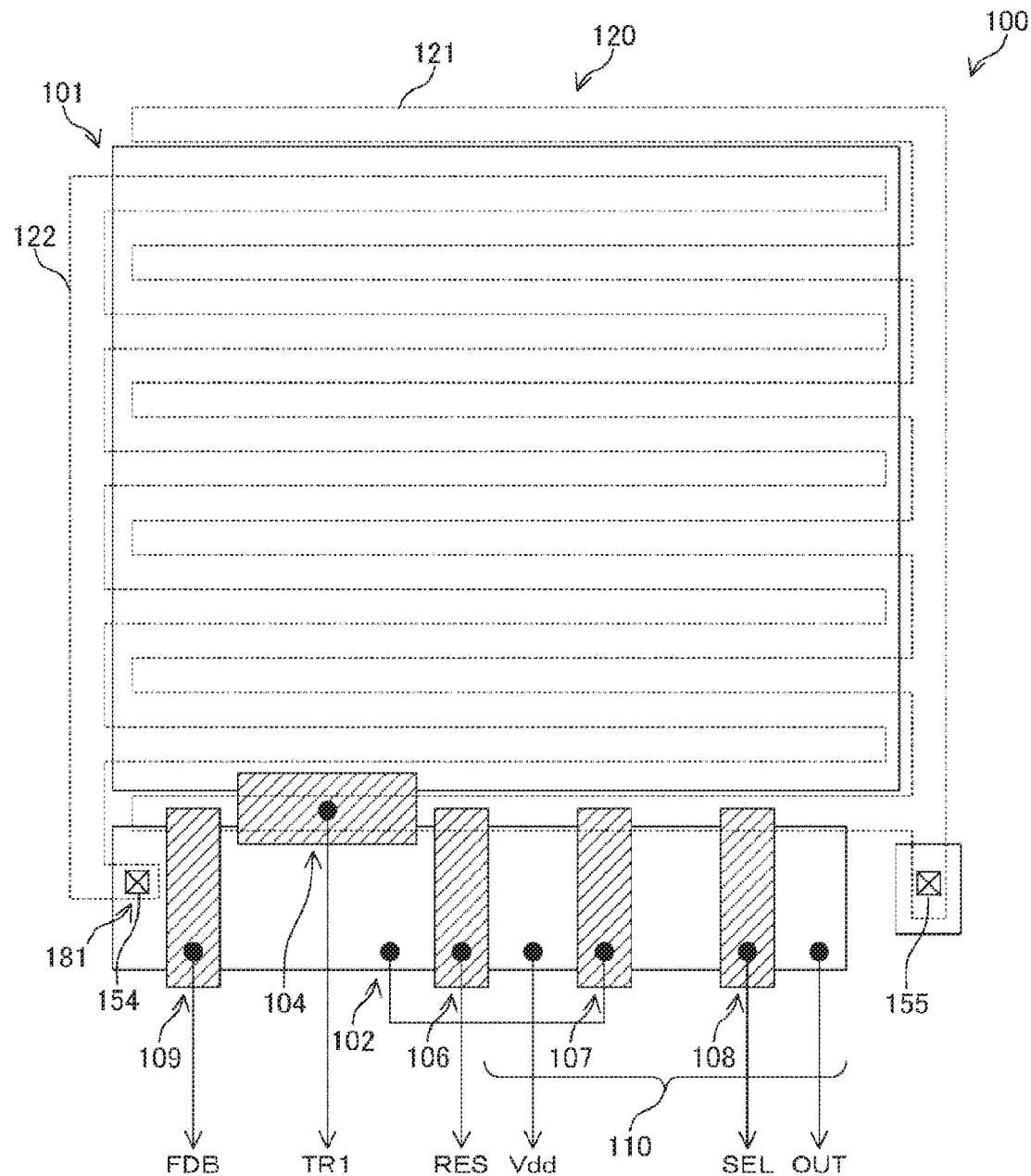

FIG. 15 is a diagram illustrating a configuration example of the pixel according to the fifth embodiment of the present technology. The figure is a diagram illustrating a configuration example of the photoelectric conversion unit 101 and the like, similarly to FIG. 5. In the figure, MOS transistor 109 is arranged adjacent to the MOS transistors 104 and 106. Specifically, a region that serves as both the drain region of the MOS transistor 104 and the source region of the MOS transistor 106 is a drain region, and the gate and a source region are formed adjacent to the semiconductor region. The contact plug 154 is formed in the source region of the MOS transistor 109 and is connected to the electrode 122. The connection portion corresponds to the node 181 in the figure. Furthermore, the pixel 100 in the figure has a configuration in which the MOS transistors 103 and 105 are omitted. The configuration of the pixel 100 other than the above is similar to the configuration of the pixel 100 described in FIG. 5, and a description thereof will not be repeated.

As described above, the pixel 100 in the figure uses the second charge holding unit 129 including the capacitor formed by the electrodes 122 and 121 for adjusting the sensitivity of the pixel 100.

The configuration of the imaging element 1 other than the above is similar to the configuration of the imaging element 1 described in the first embodiment of the present technology, and a description thereof will not be repeated.

As described above, in the imaging element 1 of the fifth embodiment of the present technology, the electrodes of the polarizing unit 120 are used as a charge holding unit for adjusting the sensitivity of the pixel 100, whereby the configuration of the pixel 100 can be simplified.

6. Modifications

[Arrangement of Polarizing Unit]

Figure 16:
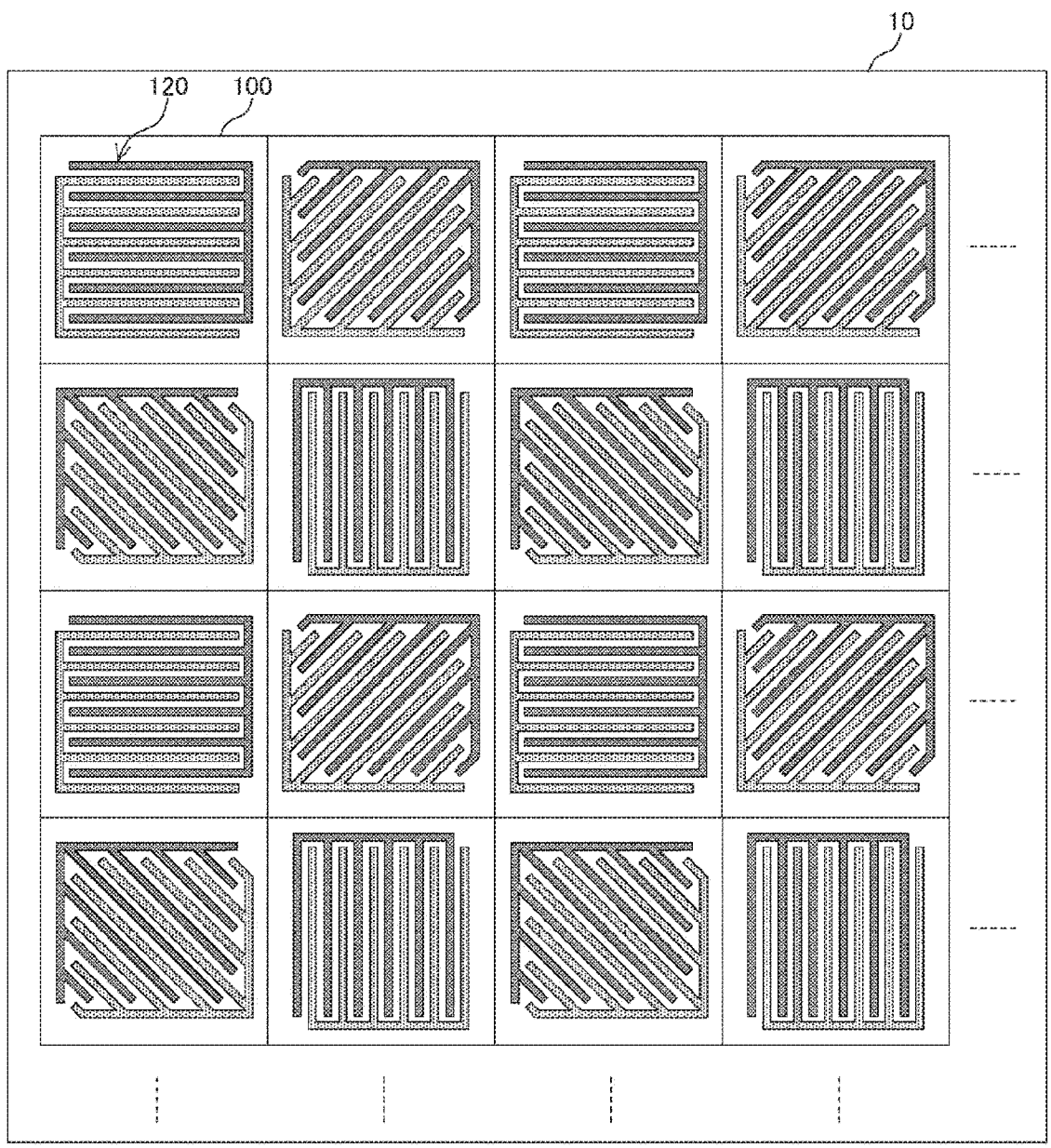

FIG. 16 is a diagram illustrating an arrangement example of a polarizing unit according to a modification of the embodiment of the present technology. The pixel 100 in the figure differs from the pixel 100 described in FIG. 3 in that the polarizing units 120 are arranged in which arrangement directions of a plurality of light-shielding lines are different from each other by 45 degrees. Such a configuration is adopted, whereby more detailed polarization information of the subject can be acquired. Note that, the figure illustrates an example in which the same arrangement pattern of the polarizing units 120 is repeated for each of the four pixels 100 arranged in two rows and two columns.

Figure 17:
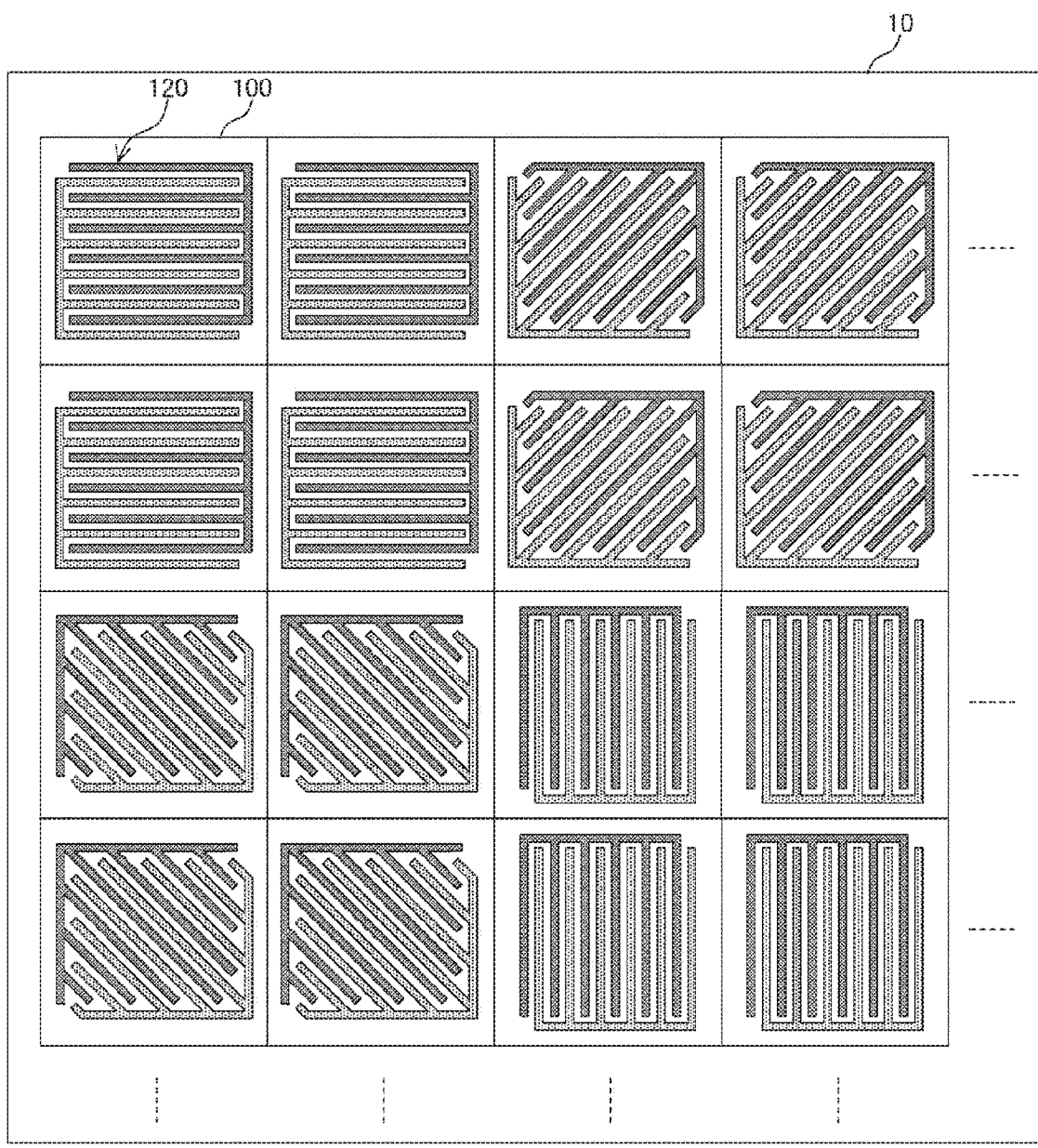

FIG. 17 is a diagram illustrating another example of the arrangement of the polarizing unit according to the modification of the embodiment of the present technology. In the figure, the polarizing units 120 having light-shielding lines in the same arrangement direction are arranged in common in the four pixels 100 arranged in two rows and two columns, and the polarizing units 120 are arranged including the light-shielding lines in arrangement directions different from each other by 45 degrees for each of the four pixels 100. In a case where the color filters 162 of the four pixels 100 are formed in a Bayer array, for example, three types of image signals of red light, green light, and blue light can be obtained for each polarization direction of the incident light from the subject.

Figure 18:
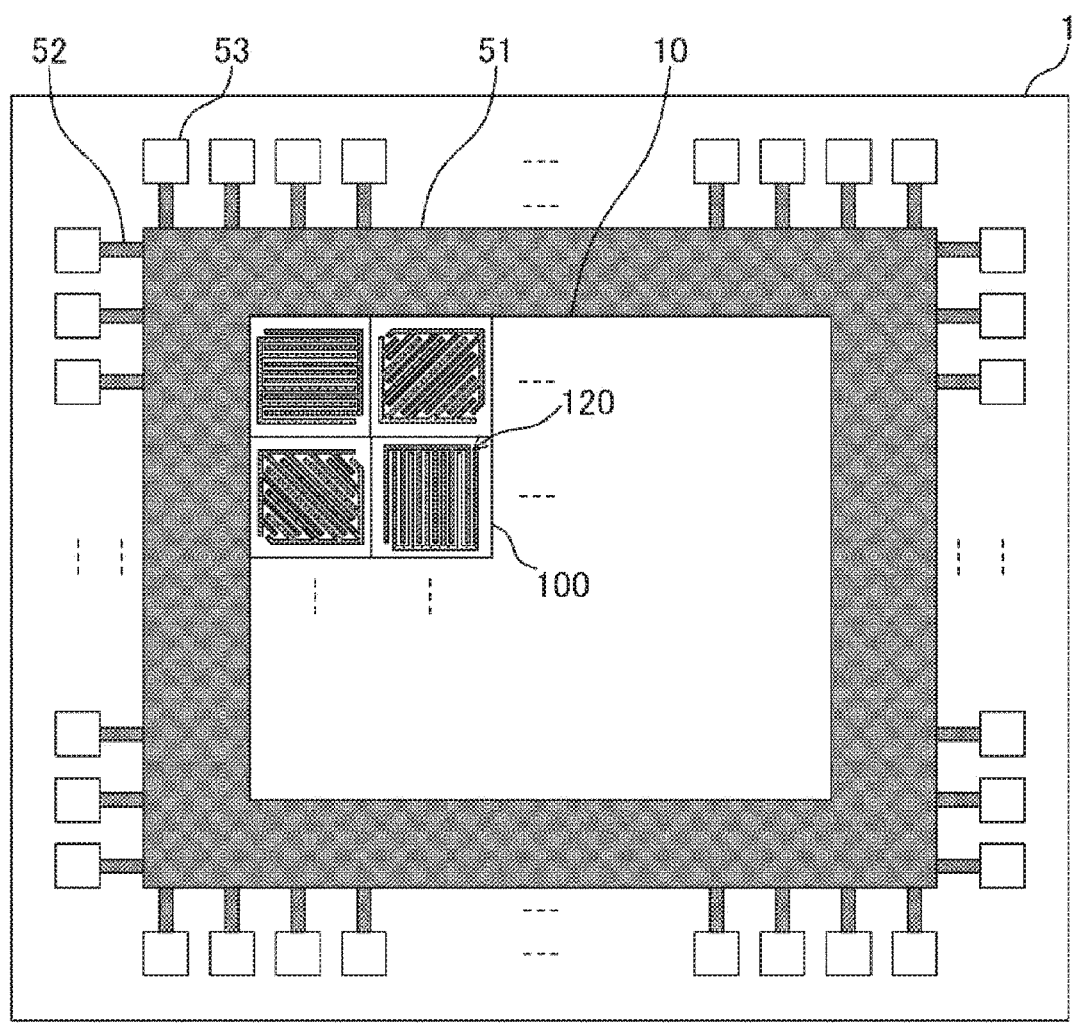

FIG. 18 is a diagram illustrating a configuration example of an imaging element according to the modification of the embodiment of the present technology. The figure illustrates an example of the imaging element 1 formed on a semiconductor chip. In the semiconductor chip illustrated in the figure, the pixel array unit 10 is arranged in a central portion, and the peripheral circuits such as the vertical drive unit 20 and the column signal processing unit 30 described in FIG. 1 are arranged around the pixel array unit 10. A wiring line 51 in the figure represents a plurality of wiring lines in the peripheral circuits. Furthermore, in the semiconductor chip in the figure, pads 53 for external connection are arranged in a peripheral portion. Wiring lines 52 are wiring lines that connect between the wiring line 51 and the pads 53. These wiring lines 51 and 52 can be formed simultaneously with the polarizing unit 120 of the pixel 100. As a result, a manufacturing process of the imaging element 1 can be simplified.

7. Application Example to Camera

The present technology can be applied to various products. For example, the present technology may be implemented as an imaging element mounted on an imaging device such as a camera.

Figure 19:
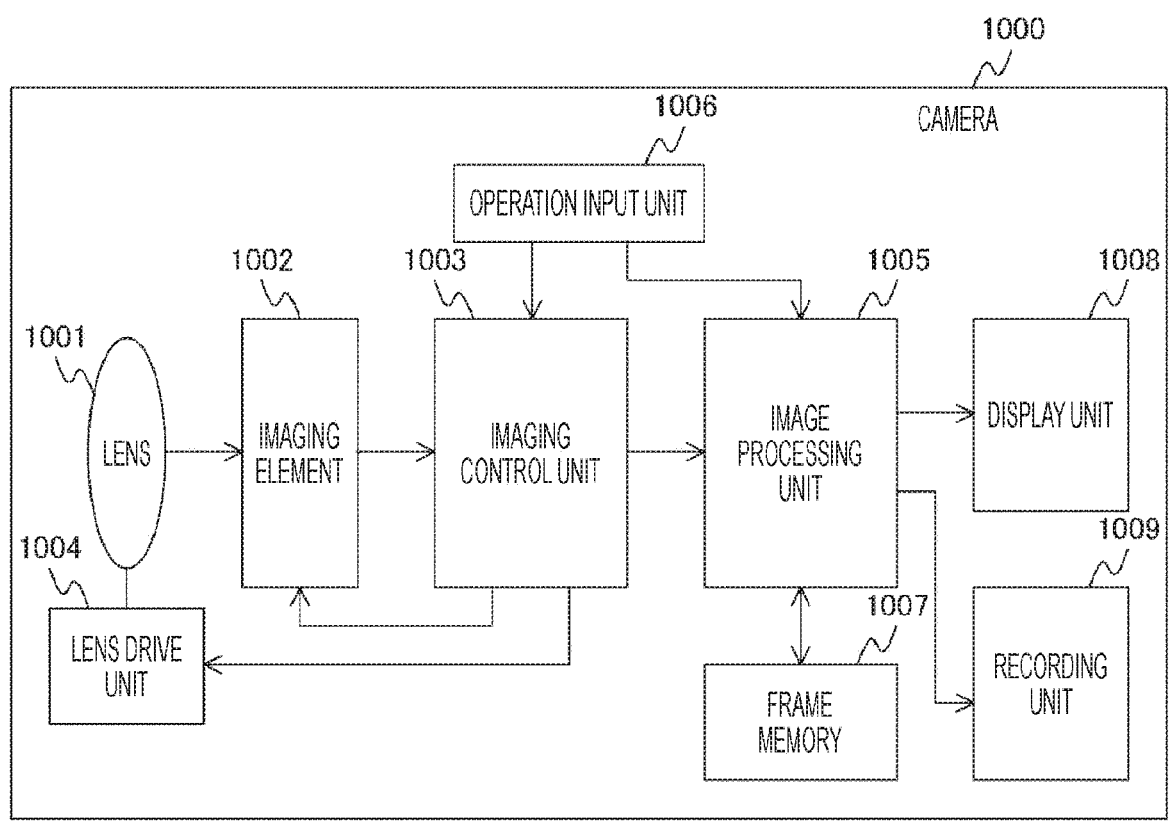

FIG. 19 is a block diagram illustrating a schematic configuration example of a camera that is an example of an imaging device to which the present technology can be applied. A camera 1000 in the figure includes a lens 1001, an imaging element 1002, an imaging control unit 1003, a lens drive unit 1004, an image processing unit 1005, an operation input unit 1006, a frame memory 1007, a display unit 1008, and a recording unit 1009.

The lens 1001 is an imaging lens of the camera 1000. The lens 1001 focuses light from a subject and causes the light incident on the imaging element 1002 described later to form an image of the subject.

The imaging element 1002 is a semiconductor element that captures the light from the subject focused by the lens 1001. The imaging element 1002 generates an analog image signal depending on the light emitted thereto, converts the image signal into a digital image signal, and outputs the digital image signal.

The imaging control unit 1003 controls imaging in the imaging element 1002. The imaging control unit 1003 controls the imaging element 1002 by generating a control signal and outputting the control signal to the imaging element 1002. Furthermore, the imaging control unit 1003 can perform autofocus in the camera 1000 on the basis of the image signal output from the imaging element 1002. Here, the autofocus is a system that detects a focal position of the lens 1001 and automatically performs adjustment. As the autofocus, a method can be used of detecting a focal position by detecting an image plane phase difference by a phase difference pixel arranged in the imaging element 1002 (image plane phase difference autofocus). Furthermore, a method can also be applied of detecting a position where contrast of an image is the highest as a focal position (contrast autofocus). The imaging control unit 1003 adjusts a position of the lens 1001 with the lens drive unit 1004 on the basis of the detected focal position, and performs autofocus. Note that, the imaging control unit 1003 can include, for example, a Digital Signal Processor (DSP) in which firmware is installed.

The lens drive unit 1004 drives the lens 1001 on the basis of the control of the imaging control unit 1003. The lens drive unit 1004 can drive the lens 1001 by changing the position of the lens 1001 by using a built-in motor.

The image processing unit 1005 processes the image signal generated by the imaging element 1002. Examples of this processing includes demosaicing for generating an image signal of a lacking color among image signals corresponding to red, green, and blue for each pixel, noise reduction for removing noise of the image signal, encoding of the image signal, and the like. Furthermore, the image processing unit 1005 can perform processing based on polarization information generated by the imaging element 1002. The image processing unit 1005 can include, for example, a microprocessor in which firmware is installed.

The operation input unit 1006 accepts an operation input from a user of the camera 1000. As the operation input unit 1006, for example, a push button or a touch panel can be used. The operation input accepted by the operation input unit 1006 is transmitted to the imaging control unit 1003 and the image processing unit 1005. Thereafter, processing is started depending on the operation input, for example, processing of imaging the subject, and the like.

The frame memory 1007 is a memory that stores a frame that is an image signal for one screen. The frame memory 1007 is controlled by the image processing unit 1005, and holds the frame in a process of image processing.

The display unit 1008 displays an image processed by the image processing unit 1005. For the display unit 1008, for example, a liquid crystal panel can be used.

The recording unit 1009 records the image processed by the image processing unit 1005. As the recording unit 1009, for example, a memory card or a hard disk can be used.

In the above, the camera has been described to which the present invention can be applied. The present technology can be applied to the imaging element 1002 among the configurations described above. Specifically, the imaging element 1 described in FIG. 1 can be applied to the imaging element 1002. The imaging element 1 is applied to the imaging element 1002, whereby polarization information of the subject can be acquired. Note that, the image processing unit 1005 is an example of a processing circuit described in the claims. The camera 1000 is an example of an imaging device described in the claims.

Note that, here, the camera has been described as an example, but the technology according to the present invention may be applied to, for example, a monitoring device or the like.

8. Application Example to Endoscopic Surgical System

The technology according to the present disclosure (the present technology) can be applied to various products. For example, the technology according to the present disclosure may be applied to an endoscopic surgical system.

Figure 20:
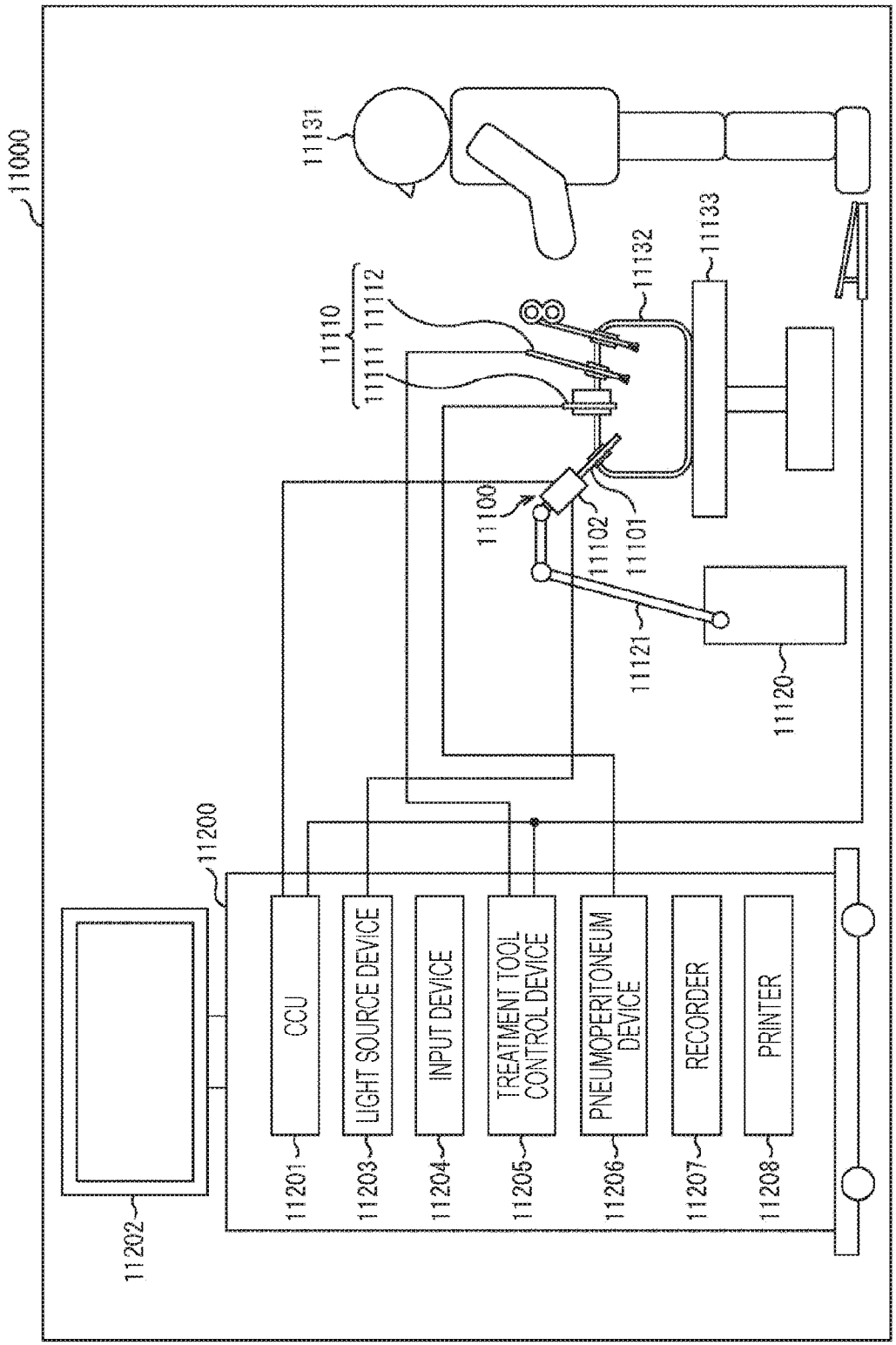

FIG. 20 is a diagram illustrating an example of a schematic configuration of an endoscopic surgical system to which the technology according to the present disclosure (the present technology) can be applied.

FIG. 20 illustrates a state in which a surgeon (doctor) 11131 is performing surgery on a patient 11132 on a patient bed 11133 using an endoscopic surgical system 11000. As illustrated, the endoscopic surgical system 11000 includes an endoscope 11100, other surgical tools 11110 such as a pneumoperitoneum tube 11111 and an energy treatment tool 11112, a support arm device 11120 that supports the endoscope 11100, and a cart 11200 on which various devices for endoscopic surgery are mounted.

The endoscope 11100 includes a lens barrel 11101 in which a region of a predetermined length from the distal end is inserted into the body cavity of the patient 11132, and a camera head 11102 connected to the proximal end of the lens barrel 11101. In the illustrated example, the endoscope 11100 formed as a so-called rigid scope including a rigid lens barrel 11101 is illustrated, but the endoscope 11100 may be formed as a so-called flexible scope including a flexible lens barrel.

At the distal end of the lens barrel 11101, an opening is provided into which an objective lens is fitted. A light source device 11203 is connected to the endoscope 11100, and light generated by the light source device 11203 is guided to the distal end of the lens barrel by a light guide extending inside the lens barrel 11101, and the light is emitted toward an observation target in the body cavity of the patient 11132 via the objective lens. Note that, the endoscope 11100 may be a forward-viewing endoscope, an oblique-viewing endoscope, or a side-viewing endoscope.

An optical system and an imaging element are provided inside the camera head 11102, and reflected light (observation light) from the observation target is focused on the imaging element by the optical system. The observation light is photoelectrically converted by the imaging element, and an electric signal corresponding to the observation light, that is, an image signal corresponding to the observation image is generated. The image signal is transmitted as RAW data to a camera control unit (CCU) 11201.

The CCU 11201 includes a central processing unit (CPU), a graphics processing unit (GPU), and the like, and comprehensively controls operation of the endoscope 11100 and a display device 11202. Moreover, the CCU 11201 receives the image signal from the camera head 11102 and applies various types of image processing to the image signal, for example, development processing (demosaic processing), and the like, for displaying the image based on the image signal.

The display device 11202 displays an image based on the image signal subjected to the image processing by the CCU 11201, by the control from the CCU 11201.

The light source device 11203 includes a light source, for example, a light emitting diode (LED) or the like, and supplies irradiation light for imaging a surgical portion or the like to the endoscope 11100.

An input device 11204 is an input interface to the endoscopic surgical system 11000. A user can input various types of information and instructions to the endoscopic surgical system 11000 via the input device 11204. For example, the user inputs an instruction or the like to change imaging conditions (type of irradiation light, magnification, focal length, and the like) for the endoscope 11100.

A treatment tool control device 11205 controls drive of the energy treatment tool 11112 for cauterization of tissue, incision, sealing of blood vessels, or the like. A pneumoperitoneum device 11206 injects a gas into the body cavity of the patient 11132 via the pneumoperitoneum tube 11111 to inflate the body cavity, for the purpose of ensuring a field of view by the endoscope 11100 and ensuring a working space of the surgeon. A recorder 11207 is a device capable of recording various types of information regarding surgery. A printer 11208 is a device capable of printing various types of information regarding surgery in various formats such as text, image, graph, and the like.

Note that, the light source device 11203 that supplies irradiation light for imaging a surgical portion to the endoscope 11100 can include a white light source including, for example, an LED, a laser light source, or a combination thereof. In a case where the white light source includes a combination of R, G, and B laser light sources, the output intensity and the output timing of each color (each wavelength) can be controlled with high accuracy, so that adjustment can be performed of the white balance of the captured image in the light source device 11203. Furthermore, in this case, it is also possible to capture an image corresponding to each of R, G, and B in time division by emitting the laser light from each of the R, G, and B laser light sources in time division to the observation target, and controlling drive of the imaging element of the camera head 11102 in synchronization with the emission timing. According to this method, a color image can be obtained without providing a color filter in the imaging element.

Furthermore, drive of the light source device 11203 may be controlled such that the intensity of light to be output is changed at predetermined time intervals. By controlling the drive of the imaging element of the camera head 11102 in synchronization with the change timing of the light intensity to acquire images in time division, and synthesizing the images, a high dynamic range image can be generated without so-called blocked up shadows or blown out highlights.

Furthermore, the light source device 11203 may be able to supply light of a predetermined wavelength band corresponding to special light observation. In the special light observation, for example, by using wavelength dependence of light absorption in a body tissue, by emitting narrow band light compared to irradiation light (in other words, white light) at the time of ordinary observation, so-called narrow band imaging is performed in which a predetermined tissue such as a blood vessel in a mucosal surface layer is imaged with high contrast. Alternatively, in the special light observation, fluorescence observation may be performed that obtain an image by fluorescence generated by emitting excitation light. In the fluorescence observation, it is possible to irradiate a body tissue with excitation light to observe the fluorescence from the body tissue (autofluorescence observation), or to locally inject a reagent such as indocyanine green (ICG) into a body tissue and irradiate the body tissue with excitation light corresponding to the fluorescence wavelength of the reagent to obtain a fluorescent image, for example. The light source device 11203 may be able to supply narrow band light and/or excitation light corresponding to such special light observation.

Figure 21:
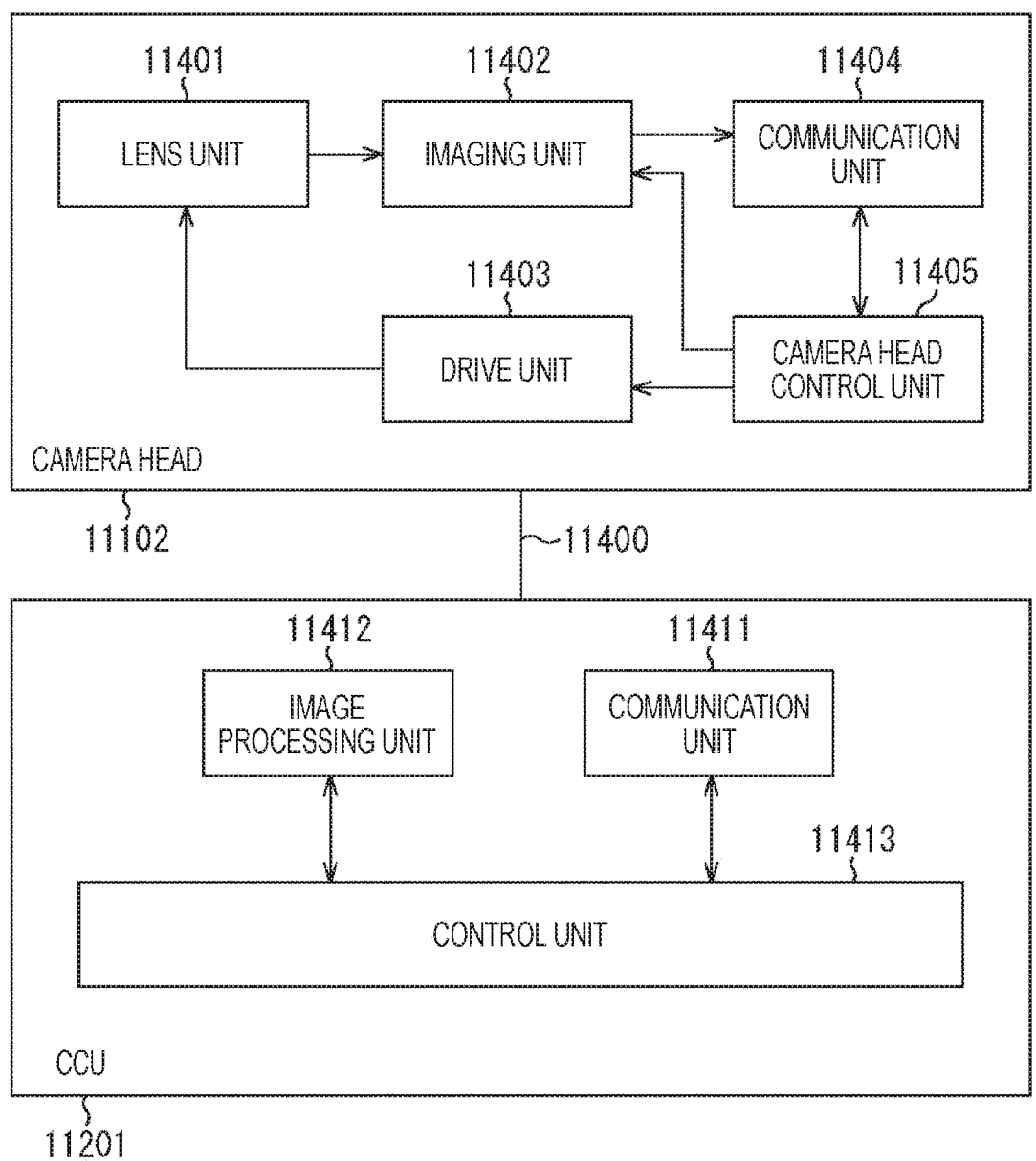

FIG. 21 is a block diagram illustrating an example of a functional configuration of the camera head 11102 and the CCU 11201 illustrated in FIG. 20.

The camera head 11102 includes a lens unit 11401, an imaging unit 11402, a drive unit 11403, a communication unit 11404, and a camera head control unit 11405. The CCU 11201 includes a communication unit 11411, an image processing unit 11412, and a control unit 11413. The camera head 11102 and the CCU 11201 are communicably connected to each other by a transmission cable 11400.

The lens unit 11401 is an optical system provided at a connection portion with the lens barrel 11101. The observation light taken in from the distal end of the lens barrel 11101 is guided to the camera head 11102 and is incident on the lens unit 11401. The lens unit 11401 includes a combination of a plurality of lenses including a zoom lens and a focus lens.

The imaging unit 11402 includes an imaging element. The imaging element constituting the imaging unit 11402 may be one (so-called single-chip) element, or a plurality of (so-called multi-chip) elements. In a case where the imaging unit 11402 includes the multi-chip type, for example, image signals corresponding to R, G, and B are generated by respective imaging elements, and the image signals are synthesized, whereby a color image may be obtained. Alternatively, the imaging unit 11402 may include a pair of imaging elements for acquiring right-eye and left-eye image signals corresponding to three-dimensional (3D) display. The 3D display is performed, whereby the surgeon 11131 can grasp the depth of living tissue in a surgical portion more accurately. Note that, in a case where the imaging unit 11402 includes the multi-chip type, a plurality of systems of the lens units 11401 can be provided corresponding to respective imaging elements.

Furthermore, the imaging unit 11402 is not necessarily provided in the camera head 11102. For example, the imaging unit 11402 may be provided inside the lens barrel 11101 immediately after the objective lens.

The drive unit 11403 includes an actuator and moves the zoom lens and the focus lens of the lens unit 11401 by a predetermined distance along the optical axis by control of the camera head control unit 11405. As a result, the magnification and the focus of the captured image by the imaging unit 11402 can be appropriately adjusted.

The communication unit 11404 includes a communication device for transmitting/receiving various types of information to/from the CCU 11201. The communication unit 11404 transmits the image signal obtained from the imaging unit 11402 as RAW data to the CCU 11201 via the transmission cable 11400.

Furthermore, the communication unit 11404 receives a control signal for controlling drive of the camera head 11102 from the CCU 11201, and supplies the control signal to the camera head control unit 11405. The control signal includes information regarding imaging conditions, for example, information that specifies the frame rate of the captured image, information that specifies the exposure value at the time of imaging, and/or information that specifies the magnification and focus of the captured image.

Note that, the above-described imaging conditions such as the frame rate, exposure value, magnification, and focus may be appropriately specified by the user, or automatically set by the control unit 11413 of the CCU 11201 on the basis of the acquired image signal. In the latter case, a so-called auto exposure (AE) function, auto-focus (AF) function, and auto white balance (AWB) function are installed in the endoscope 11100.

The camera head control unit 11405 controls the drive of the camera head 11102 on the basis of the control signal from the CCU 11201 received via the communication unit 11404.

The communication unit 11411 includes a communication device for transmitting/receiving various types of information to/from the camera head 11102. The communication unit 11411 receives the image signal transmitted from the camera head 11102 via the transmission cable 11400.

Furthermore, the communication unit 11411 transmits the control signal for controlling the drive of the camera head 11102 to the camera head 11102. The image signal and the control signal can be transmitted by electrical communication, optical communication, or the like.

The image processing unit 11412 performs various types of image processing on the image signal that is RAW data transmitted from the camera head 11102.

The control unit 11413 performs various types of control related to imaging of a surgical portion or the like by the endoscope 11100 and display of the captured image obtained by the imaging of the surgical portion or the like. For example, the control unit 11413 generates the control signal for controlling the drive of the camera head 11102.

Furthermore, the control unit 11413 causes the display device 11202 to display the captured image of the surgical portion or the like on the basis of the image signal subjected to the image processing by the image processing unit 11412. At this time, the control unit 11413 may recognize various objects in the captured image by using various image recognition technologies. For example, the control unit 11413 detects color, a shape of an edge, and the like of the object included in the captured image, thereby being able to recognize a surgical tool such as a forceps, a specific body part, bleeding, mist at the time of using the energy treatment tool 11112, or the like. When causing the display device 11202 to display the captured image, the control unit 11413 may cause the display device 11202 to superimpose and display various types of surgery assistance information on the image of the surgical portion by using the recognition result. The surgery assistance information is superimposed and displayed, and presented to the surgeon 11131, whereby the burden on the surgeon 11131 can be reduced, and the surgeon 11131 can reliably perform surgery.

The transmission cable 11400 connecting the camera head 11102 and the CCU 11201 together is an electric signal cable adaptable to communication of electric signals, an optical fiber adaptable to optical communication, or a composite cable thereof.

Here, in the illustrated example, communication is performed by wire using the transmission cable 11400, but communication between the camera head 11102 and the CCU 11201 may be performed wirelessly.

In the above, an example has been described of the endoscopic surgical system to which the technology according to the present disclosure can be applied. The technology according to the present disclosure can be applied to the imaging unit 11402 of the camera head 11102 among the configurations described above. Specifically, the imaging element 1 of FIG. 1 can be applied to the imaging unit

10402. The technology according to the present disclosure is applied to the imaging unit 10402, whereby the configuration can be simplified of the imaging unit 10402 that acquires polarization information of a subject.

Note that, the endoscopic surgical system has been described as an example here; however, the technology according to the present disclosure may be applied to others, for example, a microscopic surgical system, and the like.

9. Application Example to Mobile Body

The technology according to the present disclosure (the present technology) can be applied to various products. The technology according to the present disclosure may be implemented as a device mounted on any type of mobile body, for example, a car, an electric car, a hybrid electric car, a motorcycle, a bicycle, a personal mobility, an airplane, a drone, a ship, a robot, or the like.

Figure 22:
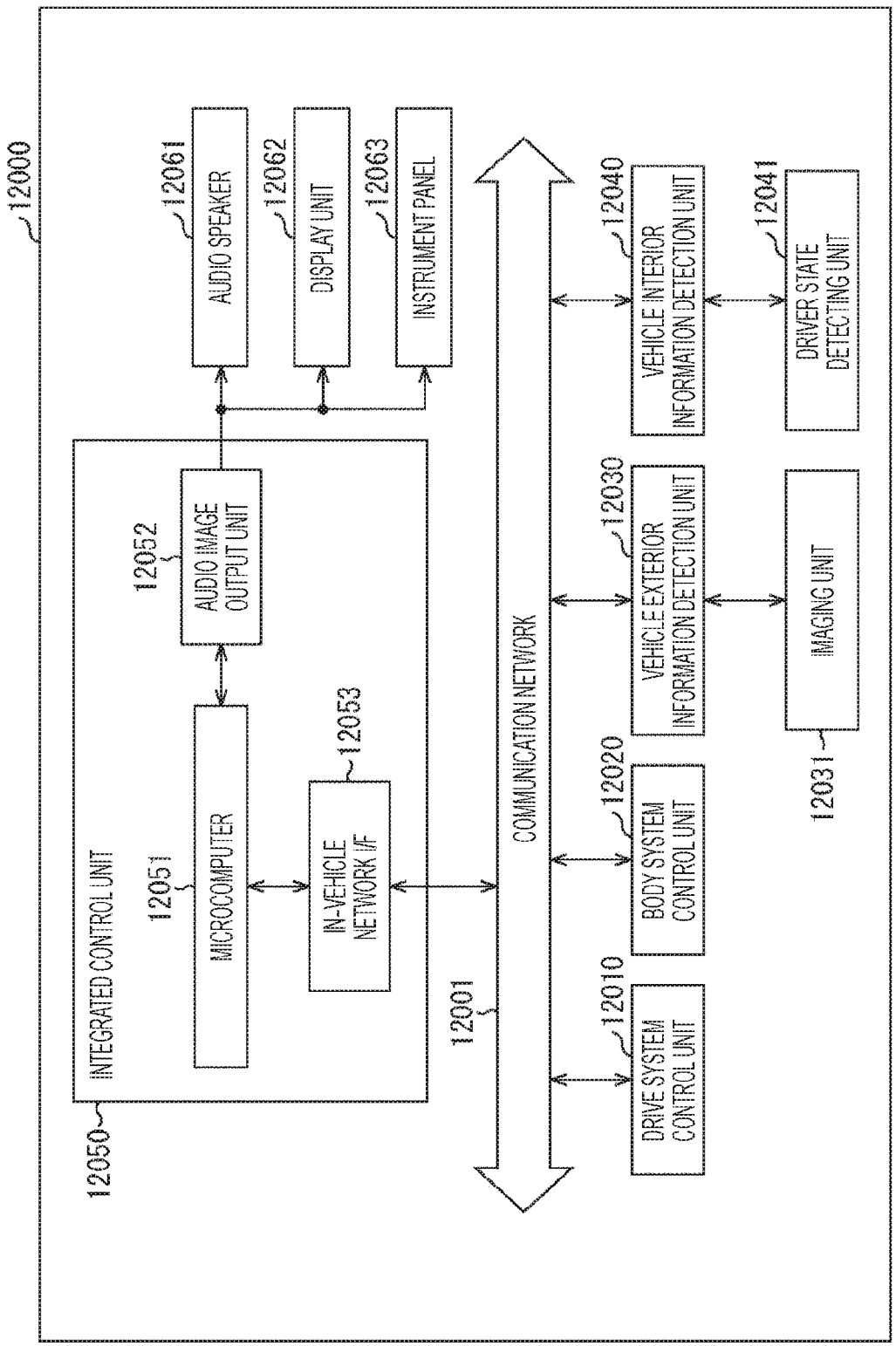

FIG. 22 is a block diagram illustrating a schematic configuration example of a vehicle control system that is an example of a mobile body control system to which the technology according to the present disclosure can be applied.

The vehicle control system 12000 includes a plurality of electronic control units connected to each other via a communication network 12001. In the example illustrated in FIG. 22, the vehicle control system 12000 includes a drive system control unit 12010, a body system control unit 12020, a vehicle exterior information detection unit 12030, a vehicle interior information detection unit 12040, and an integrated control unit 12050. Furthermore, as functional configurations of the integrated control unit 12050, a microcomputer 12051, an audio image output unit 12052, and an in-vehicle network interface (I/F) 12053 are illustrated.

The drive system control unit 12010 controls operation of devices related to a drive system of a vehicle in accordance with various programs. For example, the drive system control unit 12010 functions as a control device of a driving force generating device for generating driving force of the vehicle, such as an internal combustion engine or a driving motor, a driving force transmitting mechanism for transmitting driving force to wheels, a steering mechanism for adjusting a steering angle of the vehicle, a braking device for generating braking force of the vehicle, and the like.

The body system control unit 12020 controls operation of various devices equipped on the vehicle body in accordance with various programs. For example, the body system control unit 12020 functions as a control device of a keyless entry system, a smart key system, a power window device, or various lamps such as a head lamp, a back lamp, a brake lamp, a turn signal lamp, and a fog lamp. In this case, to the body system control unit 12020, a radio wave transmitted from a portable device that substitutes for a key, or signals of various switches can be input. The body system control unit 12020 accepts input of these radio waves or signals and controls a door lock device, power window device, lamp, and the like of the vehicle.

The vehicle exterior information detection unit 12030 detects information on the outside of the vehicle on which the vehicle control system 12000 is mounted. For example, an imaging unit 12031 is connected to the vehicle exterior information detection unit 12030. The vehicle exterior information detection unit 12030 causes the imaging unit 12031 to capture an image outside the vehicle and receives the image captured. The vehicle exterior information detection unit 12030 may perform object detection processing or distance detection processing on a person, a car, an obstacle, a sign, a character on a road surface, or the like, on the basis of the received image.

The imaging unit 12031 is an optical sensor that receives light and outputs an electric signal depending on an amount of light received. The imaging unit 12031 can output the electric signal as an image, or as distance measurement information. Furthermore, the light received by the imaging unit 12031 may be visible light, or invisible light such as infrared rays.

The vehicle interior information detection unit 12040 detects information on the inside of the vehicle. The vehicle interior information detection unit 12040 is connected to, for example, a driver state detecting unit 12041 that detects a state of a driver. The driver state detecting unit 12041 includes, for example, a camera that captures an image of the driver, and the vehicle interior information detection unit 12040 may calculate a degree of fatigue or a degree of concentration of the driver, or determine whether or not the driver is dozing, on the basis of the detection information input from the driver state detecting unit 12041.

The microcomputer 12051 can calculate a control target value of the driving force generating device, the steering mechanism, or the braking device on the basis of the information on the inside and outside of the vehicle acquired by the vehicle exterior information detection unit 12030 or the vehicle interior information detection unit 12040, and output a control command to the drive system control unit 12010. For example, the microcomputer 12051 can perform cooperative control aiming for implementing functions of advanced driver assistance system (ADAS) including collision avoidance or shock mitigation of the vehicle, follow-up traveling based on an inter-vehicle distance, vehicle speed maintaining traveling, vehicle collision warning, vehicle lane departure warning, or the like.

Furthermore, the microcomputer 12051 can perform cooperative control aiming for automatic driving that autonomously travels without depending on operation of the driver, or the like, by controlling the driving force generating device, the steering mechanism, the braking device, or the like on the basis of information on the periphery of the vehicle acquired by the vehicle exterior information detection unit 12030 or the vehicle interior information detection unit 12040.

Furthermore, the microcomputer 12051 can output a control command to the body system control unit 12020 on the basis of information on the outside of the vehicle acquired by the vehicle exterior information detection unit 12030. For example, the microcomputer 12051 can perform cooperative control aiming for preventing dazzling such as switching from the high beam to the low beam, by controlling the head lamp depending on a position of a preceding vehicle or an oncoming vehicle detected by the vehicle exterior information detection unit 12030.

The audio image output unit 12052 transmits at least one of audio and image output signals to an output device capable of visually or aurally notifying an occupant in the vehicle or the outside of the vehicle of information. In the example of FIG. 22, as the output device, an audio speaker 12061, a display unit 12062, and an instrument panel 12063 are illustrated. The display unit 12062 may include, for example, at least one of an on-board display or a head-up display.

Figure 23:
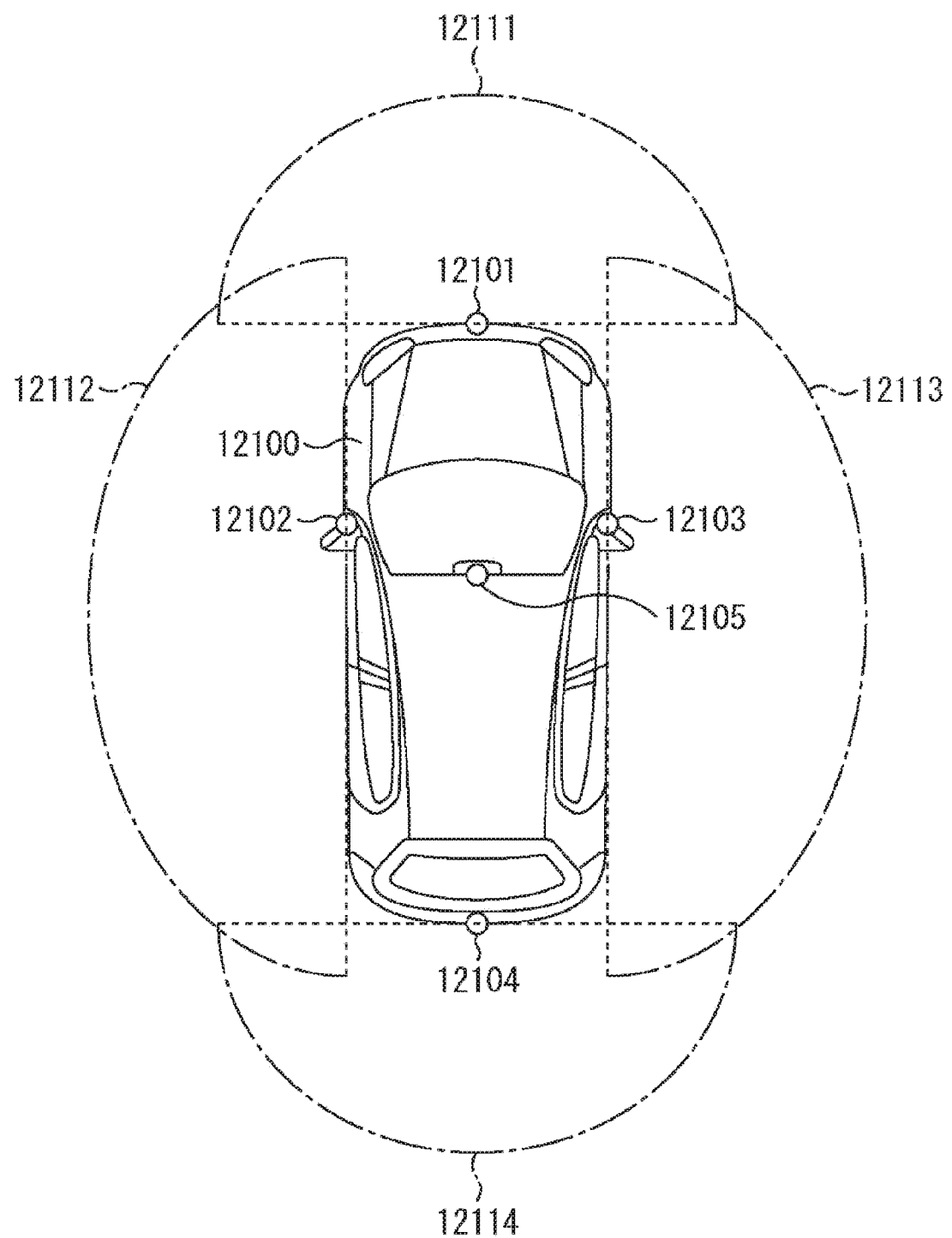

FIG. 23 is a diagram illustrating an example of installation positions of the imaging unit 12031.

In FIG. 23, a vehicle 12100 includes imaging units 12101, 12102, 12103, 12104, and 12105 as the imaging unit 12031.

Imaging units 12101, 12102, 12103, 12104, and 12105 are provided at, for example, at a position of the front nose, the side mirror, the rear bumper, the back door, the upper part of the windshield in the vehicle interior, or the like, of a vehicle 12100. The imaging unit 12101 provided at the front nose and the imaging unit 12105 provided at the upper part of the windshield in the vehicle interior mainly acquire images ahead of the vehicle 12100. The imaging units 12102 and 12103 provided at the side mirrors mainly acquire images on the sides of the vehicle 12100. The imaging unit 12104 provided at the rear bumper or the back door mainly acquires an image behind the vehicle 12100. The front images acquired by the imaging units 12101 and 12105 are mainly used for detection of a preceding vehicle, a pedestrian, an obstacle, a traffic signal, a traffic sign, a lane, or the like.

Note that, FIG. 23 illustrates an example of imaging ranges of the imaging units 12101 to 12104. An imaging range 12111 indicates an imaging range of the imaging unit 12101 provided at the front nose, imaging ranges 12112 and 12113 respectively indicate imaging ranges of the imaging units 12102 and 12103 provided at the side mirrors, an imaging range 12114 indicates an imaging range of the imaging unit 12104 provided at the rear bumper or the back door. For example, image data captured by the imaging units 12101 to 12104 are superimposed on each other, whereby an overhead image is obtained of the vehicle 12100 viewed from above.

At least one of the imaging units 12101 to 12104 may have a function of acquiring distance information. For example, at least one of the imaging units 12101 to 12104 may be a stereo camera including a plurality of imaging elements, or may be an imaging element including pixels for phase difference detection.

For example, on the basis of the distance information obtained from the imaging units 12101 to 12104, the microcomputer 12051 obtains a distance to each three-dimensional object within the imaging ranges 12111 to 12114, and a temporal change of the distance (relative speed to the vehicle 12100), thereby being able to extract, as a preceding vehicle, a three-dimensional object that is in particular a closest three-dimensional object on a traveling path of the vehicle 12100 and traveling at a predetermined speed (for example, greater than or equal to 0 km/h) in substantially the same direction as that of the vehicle 12100. Moreover, the microcomputer 12051 can set an inter-vehicle distance to be ensured in advance in front of the preceding vehicle, and can perform automatic brake control (including follow-up stop control), automatic acceleration control (including follow-up start control), and the like. As described above, it is possible to perform cooperative control aiming for automatic driving that autonomously travels without depending on operation of the driver, or the like.

For example, on the basis of the distance information obtained from the imaging units 12101 to 12104, the microcomputer 12051 can extract three-dimensional object data regarding the three-dimensional object by classifying the objects into a two-wheeled vehicle, a regular vehicle, a large vehicle, a pedestrian, and other three-dimensional objects such as a utility pole, and use the data for automatic avoidance of obstacles. For example, the microcomputer 12051 identifies obstacles in the periphery of the vehicle 12100 into an obstacle visually recognizable to the driver of the vehicle 12100 and an obstacle difficult to be visually recognized. Then, the microcomputer 12051 determines a collision risk indicating a risk of collision with each obstacle, and when the collision risk is greater than or equal to a set value and there is a possibility of collision, the microcomputer 12051 outputs an alarm to the driver via the audio speaker 12061 and the display unit 12062, or performs forced deceleration or avoidance steering via the drive system control unit 12010, thereby being able to perform driving assistance for collision avoidance.

At least one of the imaging units 12101 to 12104 may be an infrared camera that detects infrared rays. For example, the microcomputer 12051 can recognize a pedestrian by determining whether or not a pedestrian exists in the captured images of the imaging units 12101 to 12104. Such pedestrian recognition is performed by, for example, a procedure of extracting feature points in the captured images of the imaging units 12101 to 12104 as infrared cameras, and a procedure of performing pattern matching processing on a series of feature points indicating a contour of an object to determine whether or not the object is a pedestrian. When the microcomputer 12051 determines that a pedestrian exists in the captured images of the imaging units 12101 to 12104 and recognizes the pedestrian, the audio image output unit 12052 controls the display unit 12062 so that a rectangular contour line for emphasis is superimposed and displayed on the recognized pedestrian. Furthermore, the audio image output unit 12052 may control the display unit 12062 so that an icon or the like indicating the pedestrian is displayed at a desired position.

In the above, an example has been described of the vehicle control system to which the technology according to the present disclosure can be applied. The technology according to the present disclosure can be applied to the imaging unit 12031 among the configurations described above. Specifically, the imaging element 1 of FIG. 1 can be applied to the imaging unit 12031. The technology according to the present disclosure is applied to the imaging unit 12031, whereby the configuration can be simplified of the imaging unit 10402 that acquires polarization information of a subject.

Lastly, the description of each of the embodiments described above is an example of the present technology, and the present technology is not limited to the embodiments described above. For this reason, it goes without saying that various changes can be made depending on the design and the like as long as the technical idea according to the present technology is not deviated even if it is other than the embodiments described above.

Furthermore, the processing procedures described in the embodiments described above may be regarded as a method having these series of procedures, and may be regarded as a program for causing a computer to execute these series of procedures or as a recording medium for storing the program. As the recording medium, for example, a Compact Disc (CD), a Digital Versatile Disc (DVD), a memory card, and the like can be used.

Note that, the present technology can also be configured as described below.

(1) An imaging element including:
  a polarizing unit that includes a conductive member and transmits light in a specific polarization direction of incident light;
  a photoelectric conversion unit that generates charge by photoelectric conversion based on the light transmitted through the polarizing unit;
  a first charge holding unit that holds the charge generated;
  an image signal generation unit that generates an image signal depending on the charge held in the first charge holding unit; and a second charge holding unit that includes the conductive member of the polarizing unit as an electrode, and holds the charge generated.

(2) The imaging element according to (1), in which the polarizing unit includes a wire grid in which a plurality of the conductive members having linear shapes is arranged adjacently at a predetermined interval.

(3) The imaging element according to (2), in which the second charge holding unit includes a capacitor formed by two of the conductive members having linear shapes adjacent to each other among the plurality of conductive members having linear shapes.

(4) The imaging element according to (3), in which
the polarizing unit includes the conductive members having linear shapes each including an insulating layer and two conductor layers sandwiching the insulating layer, and
the second charge holding unit includes a capacitor formed by the two conductor layers.

(5) The imaging element according to (4), in which in the second charge holding unit, the two conductor layers in the conductive members having linear shapes adjacent to each other are charged to identical potentials.

(6) The imaging element according to (4), in which in the second charge holding unit, the two conductor layers in the conductive members having linear shapes adjacent to each other are charged to different potentials.

(7) The imaging element according to any of (1) to (6), in which the first charge holding unit holds the charge transferred from the second charge holding unit.

(8) The imaging element according to any of (1) to (6), in which the image signal generation unit generates an image signal depending on the charges held in the first charge holding unit and the second charge holding unit.

(9) An imaging device including:
a polarizing unit that includes a conductive member and transmits light in a specific polarization direction of incident light;
a photoelectric conversion unit that generates charge by photoelectric conversion based on the light transmitted through the polarizing unit;
a first charge holding unit that holds the charge generated;
an image signal generation unit that generates an image signal depending on the charge held in the first charge holding unit;
a second charge holding unit that includes the conductive member of the polarizing unit as an electrode, and holds the charge generated; and
a processing circuit that processes the image signal generated.

REFERENCE SIGNS LIST

1 Imaging element
10 Pixel array unit
20 Vertical drive unit
30 Column signal processing unit
40 Control unit
100 Pixel
101 Photoelectric conversion unit
102 First charge holding unit
103 to 109 MOS transistor
120 Polarizing unit
121, 122 Electrode
123, 123a, 123b Light absorbing layer
124, 151 Insulating layer
125, 125a, 125b light reflecting layer
129 Second charge holding unit
130 Semiconductor substrate
131 Well region
150 Wiring region
152 Wiring layer
154, 155 Contact plug
161 On-chip lens
162 Color filter
163 Light-shielding film
164 Planarizing film
1000 Camera
1002 Imaging element
1005 Image processing unit
10402, 12031, 12101 to 12105 Imaging unit

The invention claimed is:

1. An imaging element comprising:
a polarizing unit that includes a conductive member and transmits light in a specific polarization direction of incident light;
a photoelectric conversion unit that generates charge by photoelectric conversion based on the light transmitted through the polarizing unit;
a first charge holding unit that holds the charge generated;
an image signal generation unit that generates an image signal depending on the charge held in the first charge holding unit; and
a second charge holding unit that includes the conductive member of the polarizing unit as an electrode, and holds the charge generated.

2. The imaging element according to claim 1, wherein the polarizing unit includes a wire grid in which a plurality of the conductive members having linear shapes is arranged adjacently at a predetermined interval.

3. The imaging element according to claim 2, wherein the second charge holding unit includes a capacitor formed by two of the conductive members having linear shapes adjacent to each other among the plurality of conductive members having linear shapes.

4. The imaging element according to claim 3, wherein
the polarizing unit includes the conductive members having linear shapes each including an insulating layer and two conductor layers sandwiching the insulating layer, and
the second charge holding unit includes a capacitor formed by the two conductor layers.

5. The imaging element according to claim 4, wherein in the second charge holding unit, the two conductor layers in the conductive members having linear shapes adjacent to each other are charged to identical potentials.

6. The imaging element according to claim 4, wherein in the second charge holding unit, the two conductor layers in the conductive members having linear shapes adjacent to each other are charged to different potentials.

7. The imaging element according to claim 1, wherein the first charge holding unit holds the charge transferred from the second charge holding unit.

8. The imaging element according to claim 1, wherein the image signal generation unit generates an image signal depending on the charges held in the first charge holding unit and the second charge holding unit.

9. An imaging device comprising:
a polarizing unit that includes a conductive member and transmits light in a specific polarization direction of incident light;
a photoelectric conversion unit that generates charge by photoelectric conversion based on the light transmitted through the polarizing unit;

a first charge holding unit that holds the charge generated;

an image signal generation unit that generates an image signal depending on the charge held in the first charge holding unit;

a second charge holding unit that includes the conductive member of the polarizing unit as an electrode, and holds the charge generated; and a processing circuit that processes the image signal generated.

* * * * *